(12) United States Patent
Kim et al.

(10) Patent No.: US 11,342,234 B2
(45) Date of Patent: May 24, 2022

(54) SEMICONDUCTOR DEVICE AND NONVOLATILE MEMORY DEVICE INCLUDING CRACK DETECTION STRUCTURE

(71) Applicant: Samsung Electronics Co., Ltd., Suwon-si (KR)

(72) Inventors: Taehyo Kim, Daegu (KR); Daeseok Byeon, Seongnam-si (KR); Chanho Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 150 days.

(21) Appl. No.: 16/846,724

(22) Filed: Apr. 13, 2020

(65) Prior Publication Data
US 2021/0074596 A1 Mar. 11, 2021

(30) Foreign Application Priority Data
Sep. 6, 2019 (KR) .................. 10-2019-0110551

(51) Int. Cl.
*G01R 31/26* (2020.01)
*H01L 23/552* (2006.01)
(Continued)

(52) U.S. Cl.
CPC ......... *H01L 22/30* (2013.01); *G01N 21/9505* (2013.01); *H01L 23/544* (2013.01)

(58) Field of Classification Search
CPC . H01L 23/573; H01L 23/585; H01L 29/4916; H01L 23/5283; H01L 22/34; G01R 31/2884
See application file for complete search history.

(56) References Cited

U.S. PATENT DOCUMENTS 6,649,986 B1 11/2003 Ishizaki et al.
7,700,944 B2 4/2010 Nishizawa
(Continued)

FOREIGN PATENT DOCUMENTS

JP 2005-0347651 A 12/2005
JP 4370343 B2 11/2009
(Continued)

*Primary Examiner* — Brian Turner
(74) *Attorney, Agent, or Firm* — Harness, Dickey & Pierce, P.L.C.

(57) ABSTRACT

A semiconductor device includes a semiconductor die, a semiconductor integrated circuit, an outer crack detection structure, a plurality of inner crack detection structures and a plurality of path selection circuits. The semiconductor die includes a central region and an edge region surrounding the central region. The semiconductor integrated circuit is in a plurality of sub regions of the central region. The outer crack detection structure is in the edge region. The plurality of inner crack detection structures are respectively in the plurality of sub regions, respectively. The path selection circuits are configured to control an electrical connection between the outer crack detection structure and the plurality of inner crack detection structures. A crack in the central region in addition to a crack in the edge region may be detected efficiently through selective electrical connection of the outer crack detection structure and the inner crack detection structures.

20 Claims, 30 Drawing Sheets

(51) Int. Cl.
    *H01L 23/522*     (2006.01)
    *H01L 23/528*     (2006.01)
    *H01L 23/50*     (2006.01)
    *H01L 21/66*     (2006.01)
    *H01L 23/544*     (2006.01)
    *G01N 21/95*     (2006.01)

(56) References Cited

U.S. PATENT DOCUMENTS

| | | |
|---|---|---|
| 7,863,917 B2 | 1/2011 | Park |
| 7,948,249 B2 | 5/2011 | Park |
| 8,497,695 B2 | 7/2013 | Matoba et al. |
| 9,196,382 B2 | 11/2015 | Lee |
| 9,443,611 B2 | 9/2016 | Tokunaga et al. |
| 2012/0261663 A1 | 10/2012 | Tsuji |
| 2014/0375341 A1* | 12/2014 | Fender .................. H01L 23/585 |
| | | 324/693 |
| 2017/0125360 A1* | 5/2017 | Lee ....................... H01L 23/573 |
| 2018/0138098 A1* | 5/2018 | Schneider ............. H01L 23/528 |
| 2019/0011496 A1* | 1/2019 | Van Gemert ......... H01L 23/528 |
| 2020/0025820 A1* | 1/2020 | Zhao .................... G09G 3/3208 |

FOREIGN PATENT DOCUMENTS

| | | |
|---|---|---|
| JP | 5174505 B2 | 4/2013 |
| KR | 100750192 B1 | 8/2007 |
| KR | 20160108930 A | 9/2016 |

* cited by examiner

1000

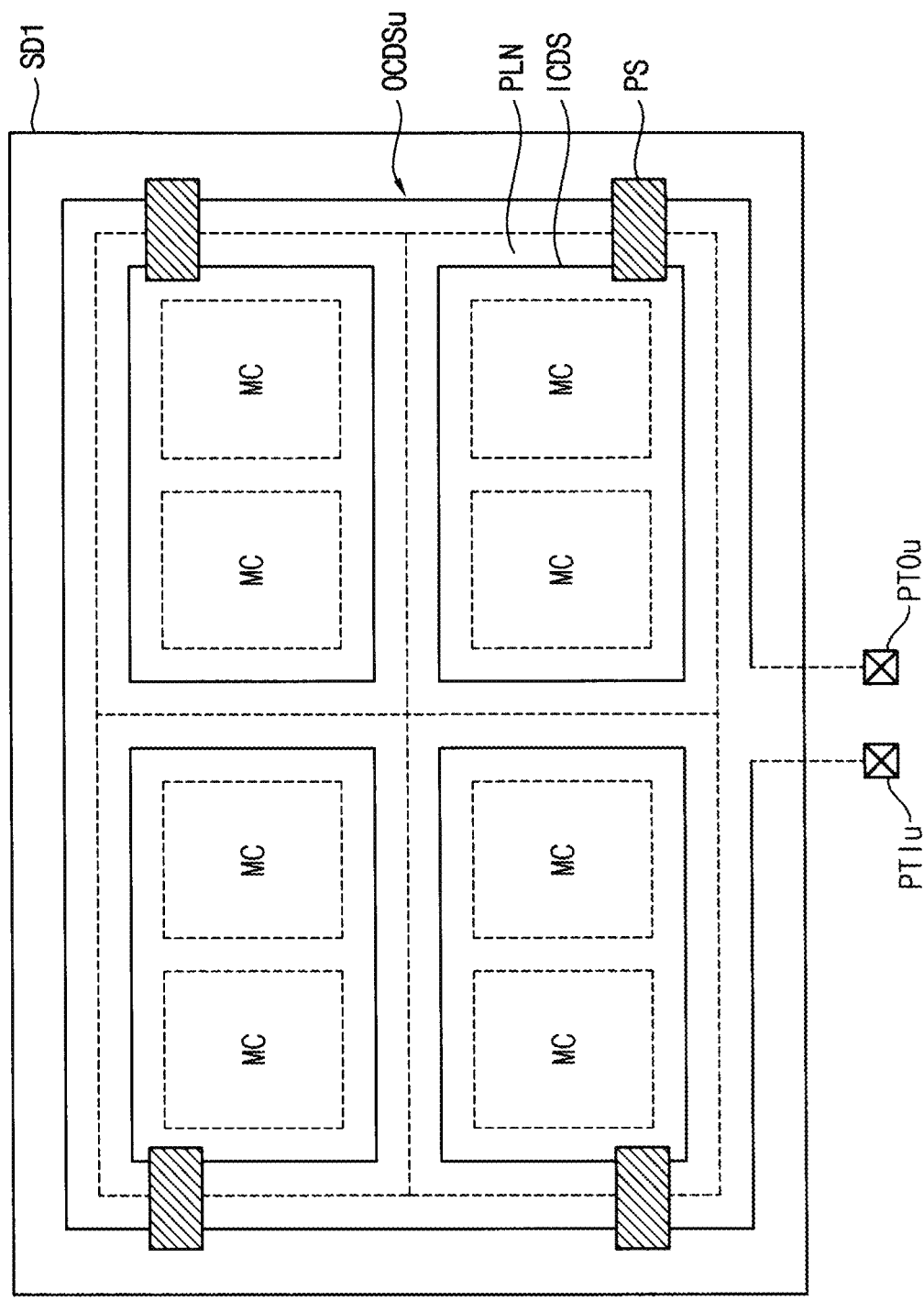

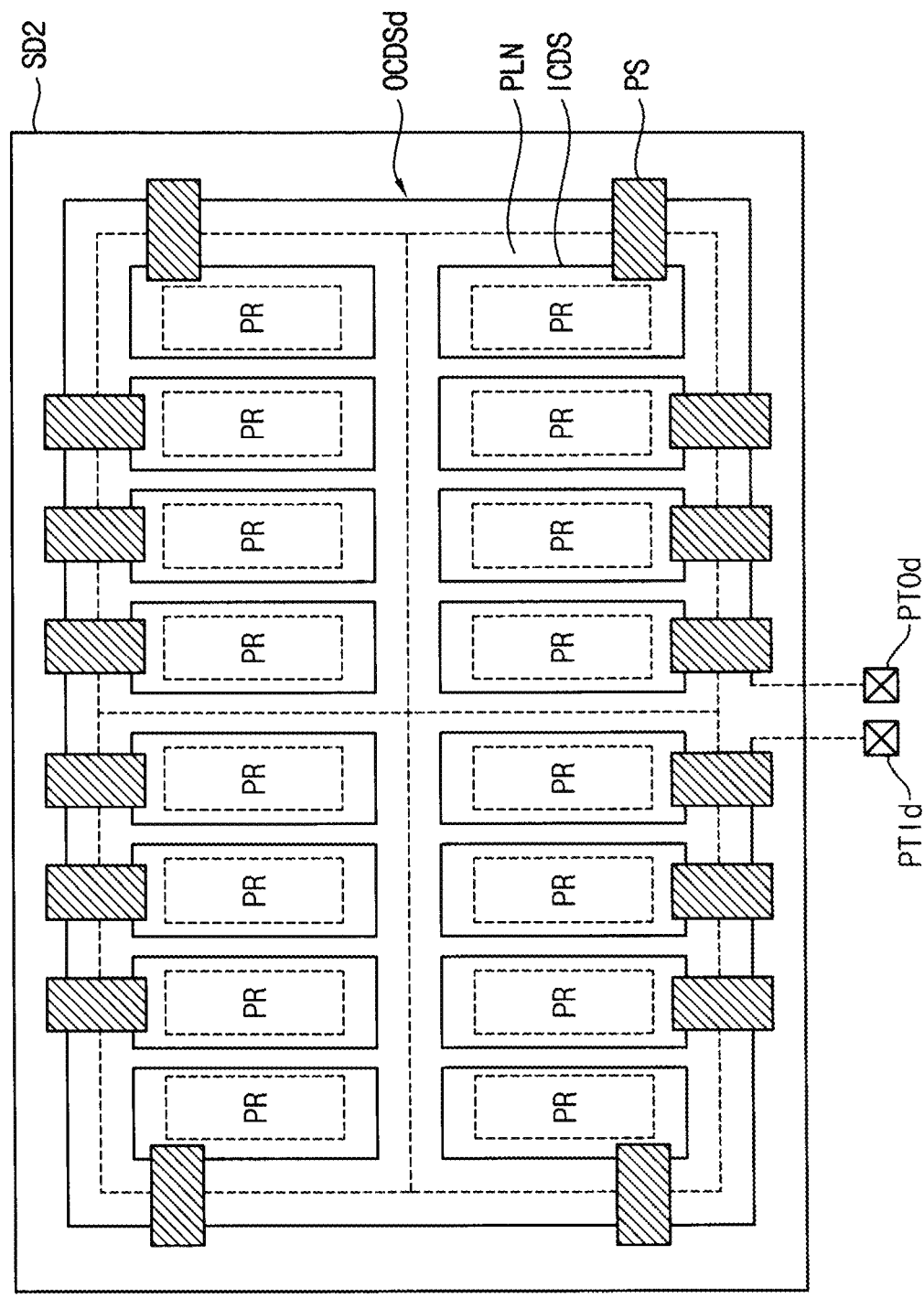

SEMICONDUCTOR DEVICE AND NONVOLATILE MEMORY DEVICE INCLUDING CRACK DETECTION STRUCTURE

CROSS-REFERENCE TO RELATED APPLICATION

This U.S. non-provisional application claims priority under 35 USC § 119 to Korean Patent Application No. 10-2019-0110551, filed on Sep. 6, 2019, in the Korean Intellectual Property Office (KIPO), the disclosure of which is incorporated by reference herein in its entirety.

BACKGROUND

1. Technical Field

Example embodiments relate generally to semiconductor integrated circuits, and more particularly to a semiconductor device and a nonvolatile memory device including a crack detection structure

2. Discussion of the Related Art

In general, integrated circuits are manufactured by forming repeated patterns in a wafer of semiconductor material. The wafer may be cut or diced into a plurality of semiconductor dies, and the respective semiconductor die may be packaged into a semiconductor chip. Cracks may occur in the semiconductor die during the cutting and packaging processes. To reduce yield of defective products, the semiconductors are inspected to detect the cracks.

SUMMARY

Some example embodiments may provide a semiconductor device and a nonvolatile memory device for enhancing detectability of crack penetration of various types. According to example embodiments, a semiconductor device includes a semiconductor die, a semiconductor integrated circuit, an outer crack detection structure, a plurality of inner crack detection structures and a plurality of path selection circuits. The semiconductor die includes a central region and an edge region surrounding the central region. The semiconductor integrated circuit is in a plurality of sub regions of the central region. The outer crack detection structure is in the edge region. The plurality of inner crack detection structures are formed in the plurality of sub regions, respectively. The plurality of path selection circuits control an electrical connection between the outer crack detection structure and the plurality of inner crack detection structures.

According to example embodiments, a nonvolatile memory device includes a first semiconductor die, a second semiconductor die, a memory cell structure, a peripheral circuit, an outer crack detection structure, a plurality of inner crack detection structures and a plurality of path selection circuits. The first semiconductor die is stacked in a vertical direction on the second semiconductor die, and each of the first semiconductor die and second semiconductor die includes a central region and an edge region surrounding the central region. The memory cell structure is in a plurality of upper sub regions of the central region of the first semiconductor die. The peripheral circuit is in a plurality of lower sub regions of the central region of the second semiconductor die. The outer crack detection structure is in the edge region of the first semiconductor die and the second semiconductor die. The plurality of inner crack detection structures are in the plurality of upper sub regions, respectively, and the plurality of lower sub regions. The plurality of path selection circuits control an electrical connection between the outer crack detection structure and the plurality of inner crack detection structures.

According to example embodiments, a storage device system include one or more nonvolatile memory devices and processing circuitry configured to control access to the nonvolatile memory devices. Each of the nonvolatile memory devices includes the first semiconductor die, the second semiconductor die, the memory cell structure, the peripheral circuit, the outer crack detection structure, the plurality of inner crack detection structures and the plurality of path selection circuits as described above.

The semiconductor device and the nonvolatile memory device according to example embodiments may efficiently detect a crack in the central region in addition to a crack in the edge region through selective electrical connection of the outer crack detection structure and the inner crack detection structures.

In addition, the semiconductor device and the nonvolatile memory device according to example embodiments may detect crack penetration of various types thoroughly using the three-dimensional crack detection structure extending in the vertical direction. The semiconductor device and the nonvolatile memory device according to example embodiments may reduce or prevent yield of inferior products with enhanced detectability of the crack and the crack position.

BRIEF DESCRIPTION OF THE DRAWINGS

Example embodiments of the present disclosure will be more clearly understood from the following detailed description taken in conjunction with the accompanying drawings.

FIGS. 27A and 27B are top views illustrating a layout of a first semiconductor die of a nonvolatile memory device according to example embodiments.

FIGS. 28A, 28B and 28C are top views illustrating a layout of a second semiconductor die of a nonvolatile memory device according to example embodiments.

DETAILED DESCRIPTION OF EMBODIMENTS

Figure 1:
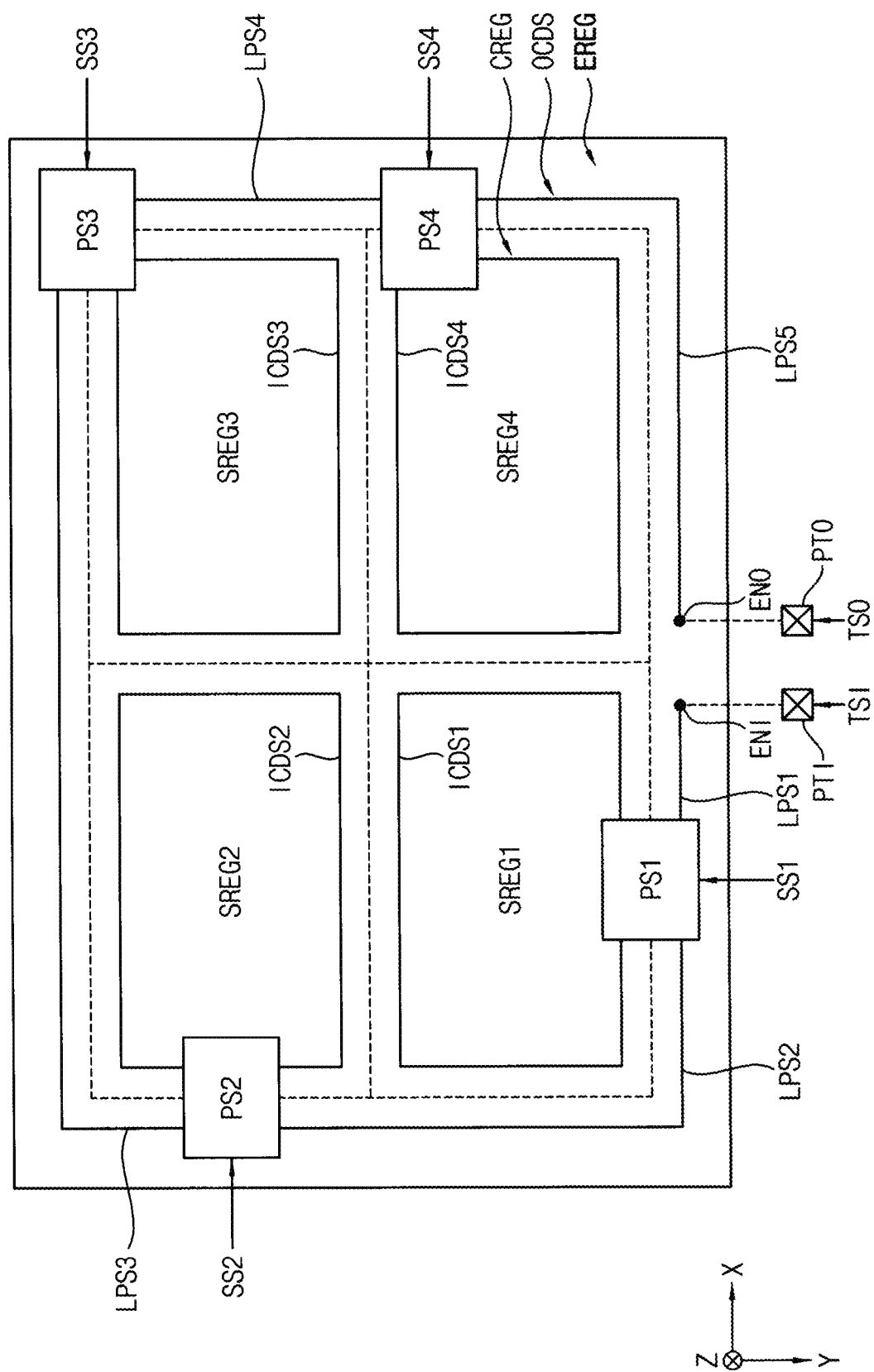
FIG. 1 is a top view illustrating a layout of a semiconductor device according to example embodiments.

Various example embodiments will be described more fully hereinafter with reference to the accompanying drawings, in which some example embodiments are shown. In the drawings, like numerals refer to like elements throughout. The repeated descriptions may be omitted.

FIG. 1 is a top view illustrating a layout of a semiconductor device according to example embodiments.

Referring to FIG. 1, a semiconductor device 1000 includes at least one semiconductor die. The semiconductor die includes a central region CREG and an edge region EREG surrounding the central region CREG. The central region CREG may be divided into a plurality of sub regions SREG1~SREG4, and various semiconductor integrated circuits depending on a kind or a type of the semiconductor device 1000 may be formed in the plurality of sub regions SREG1~SREG4. For example, the semiconductor device 1000 may be a nonvolatile memory device and a memory integrated circuit as will be described below may be formed in the central region CREG of the semiconductor die.

An outer crack detection structure OCDS is formed in the edge region EREG, and a plurality of inner crack detection structures ICDS1~ICDS4 are respectively formed in the plurality of sub regions SREG1~SREG4. A plurality of path selection circuits PS1~PS4 control an electrical connection between the outer crack detection structure OCDS and the plurality of inner crack detection structures ICDS1~ICDS4. The plurality of path selection circuits PS1~PS4 may operate in response to a plurality of switch signals SS1~SS4, respectively.

The outer crack detection structure OCDS may be divided into a plurality of loop segments LPS1~LPS5 and the plurality of loop segments LPS1~LPS5 may be electrically connected via the plurality of path selection circuits PS1~PS4 to form a conduction loop having an input end node ENI and an output end node ENO. The input end node ENI may be connected to a test input pad PTI receiving a test input signal TSI and the output end node ENO may be connected to a test output pad PTO outputting a test output signal TSO.

Figure 2:
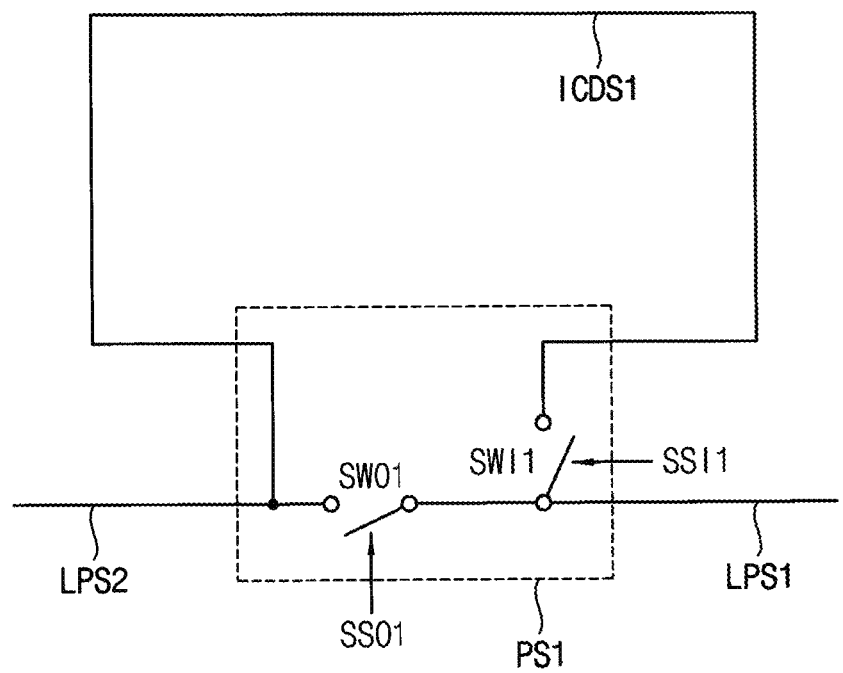
FIG. 2 is a diagram illustrating an example embodiment of a path selection circuit included in the semiconductor device of FIG. 1.

FIG. 2 is a diagram illustrating an example embodiment of a path selection circuit included in the semiconductor device of FIG. 1. FIG. 2 illustrates only an example embodiment of a first path selection circuit PS1 corresponding to a first inner crack detection structure ICDS1 included in FIG. 1 and the same descriptions may be applied to the other path selection circuits PS2~PS4.

Referring to FIG. 2, a first end of a first inner crack detection structure ICDS1 of the plurality of inner crack detection structures ICDS1~ICDS4 may be connected to the path selection circuit PS1 and a second end of the first inner crack detection structure ICDS1 may be connected to a second loop segment LPS2 of the plurality of loop segments LPS1~LPS5.

The first path selection circuit PS1 may include an outer switch SWO1 and an inner switch SWI1. The outer switch SWO may be connected between the first loop segment LPS1 and the second loop segment LPS2. The inner switch SWI1 may be connected between the first inner crack detection structure ICDS1 and the first loop segment LPS2.

The first end of the first inner crack detection structure ICDS1 may be connected to the inner switch SWI1 and the second end of the first inner crack detection structure ICDS1 may be connected to the second loop segment LPS2.

The outer switch SWO1 may receive an outer connection signal SSO1 to be turned on activation of the outer connection signal SSO1, and the inner switch SWI1 may receive an inner connection signal SSI1 to be turned on activation of the inner connection signal SSI1. As such, the switch signal SS1 in FIG. 1 may include the one outer connection signal SSO1 and the one inner connection signal SSI1.

Figure 3A:
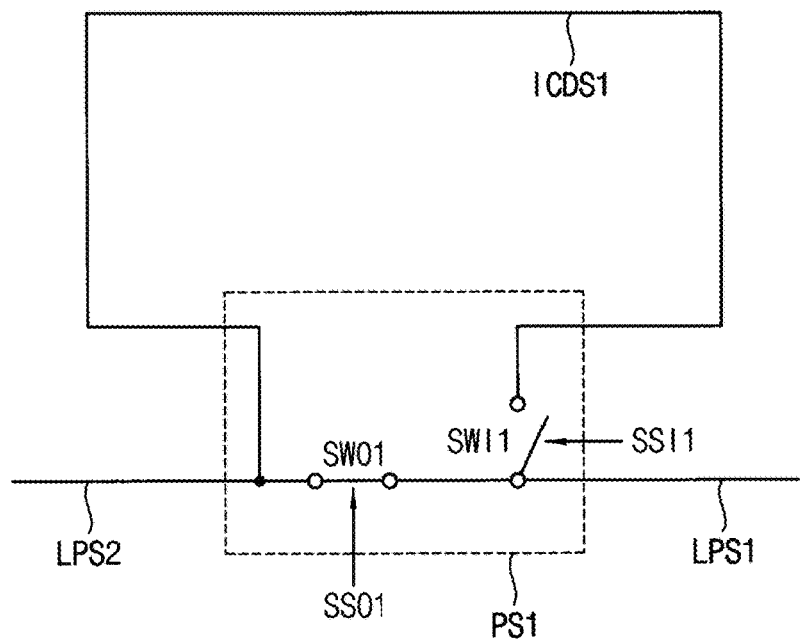
FIGS. 3A and 3B are diagrams illustrating a switching operation of the path selection circuit of FIG. 2.
Figure 3B:
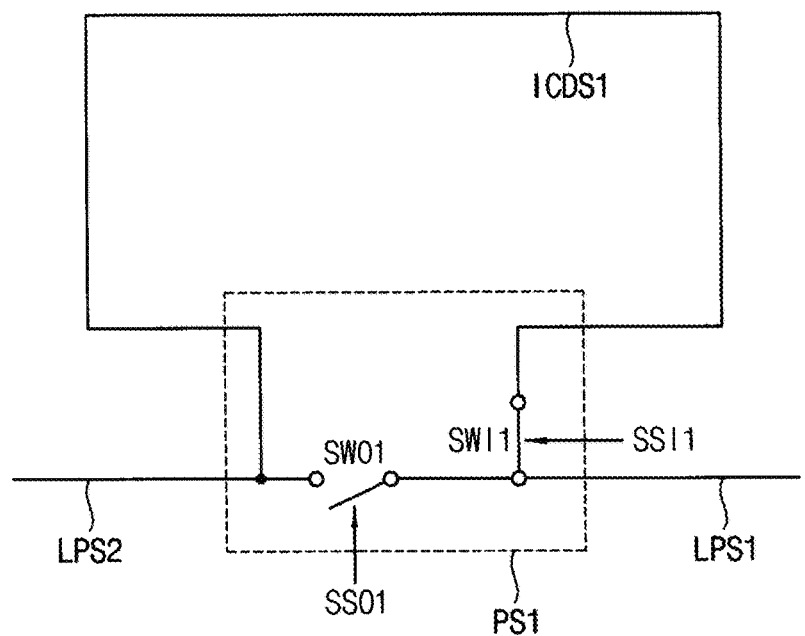

FIGS. 3A and 3B are diagrams illustrating a switching operation of the path selection circuit of FIG. 2.

Referring to FIGS. 3A and 3B, one of the outer connection signal SSO1 and the inner connection signal SSI1 may be selectively activated and one of the outer switch SWO1 and the inner switch SSI1 may be selectively turned on. A crack in the edge region EREG may be detected when the outer switch SWO1 is turned on as illustrated in FIG. 3A. In contrast, a crack in a first sub region SREG1 of the plurality of sub regions SREG1~SREG4 may be detected when the inner switch SWI1 is turned on as illustrated in FIG. 3B.

Figure 4:
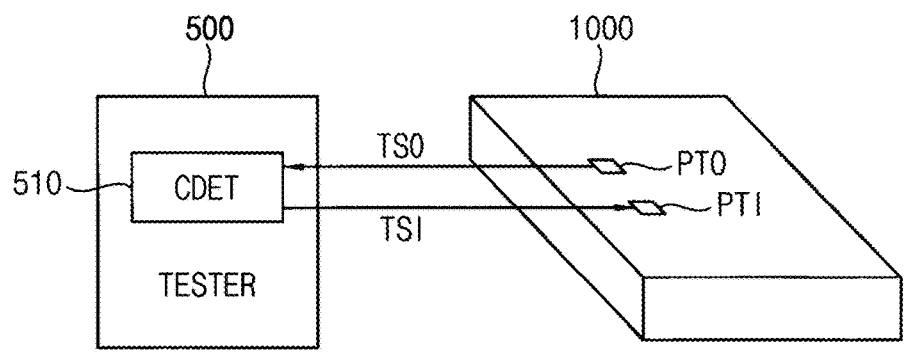
FIG. 4 is a block diagram illustrating a test system according to example embodiments.

FIG. 4 is a block diagram illustrating a test system according to example embodiments.

Referring to FIG. 4, a test system may include a tester 500 and a semiconductor device 1000.

The semiconductor device 1000 may include crack detection structures as described above, that is, the outer crack detection structure OCDS and the plurality of inner crack detection structures ICDS1~ICDS4. The outer crack detection OCDS may form a conduction loop through the plurality of path selection circuits PS1~PS4 to electrically connect the input end node ENI and the output end node ENO in a ring shape. The input end node ENI and the output end node ENO of the outer crack detection structure OCDS may be connected to the test input pad PTI and the test output pad PTO formed on a surface of the semiconductor die of the semiconductor device 1000 so that the conduction loop may be connected to the tester 500 through the test input and output pads PTI and PTO.

The tester 500 may include a crack detector CDET 510. The crack detector 510 may apply the test input signal TSI to the test input pad PTI, and then receive the test output signal TSO through the test output pad PTO, where the test output signal TSO corresponds to the test input signal TSI after passing through the crack detection structures in the semiconductor device 1000. The crack detector 510 may determine the crack occurrence by comparing the test input signal TSI and the test output signal TSO.

Figure 5:
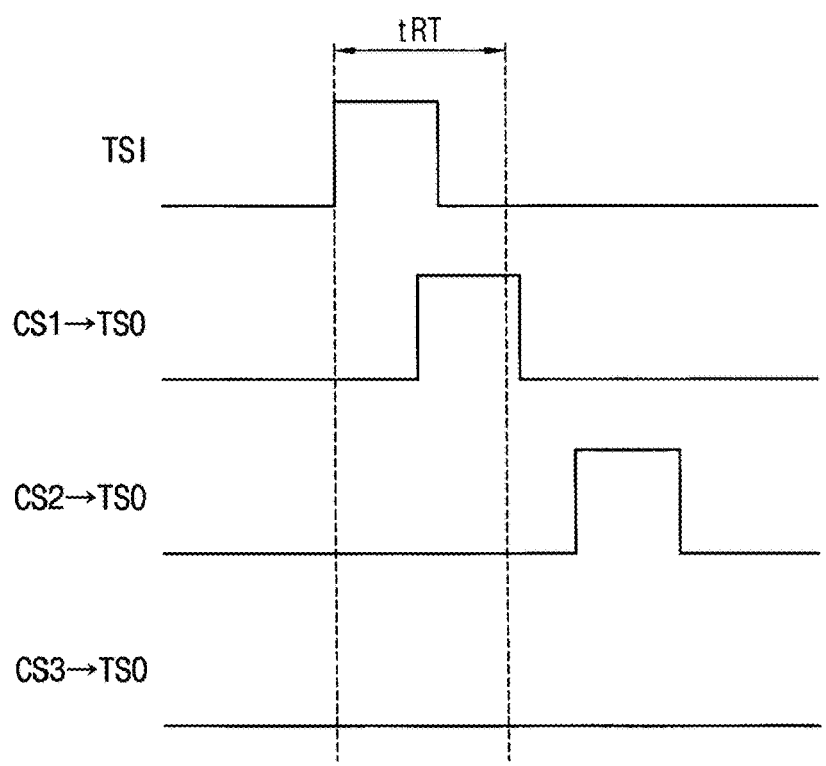
FIGS. 5 and 6 are timing diagrams illustrating an example of signals for detecting a crack in a semiconductor device according to example embodiments.
Figure 6:
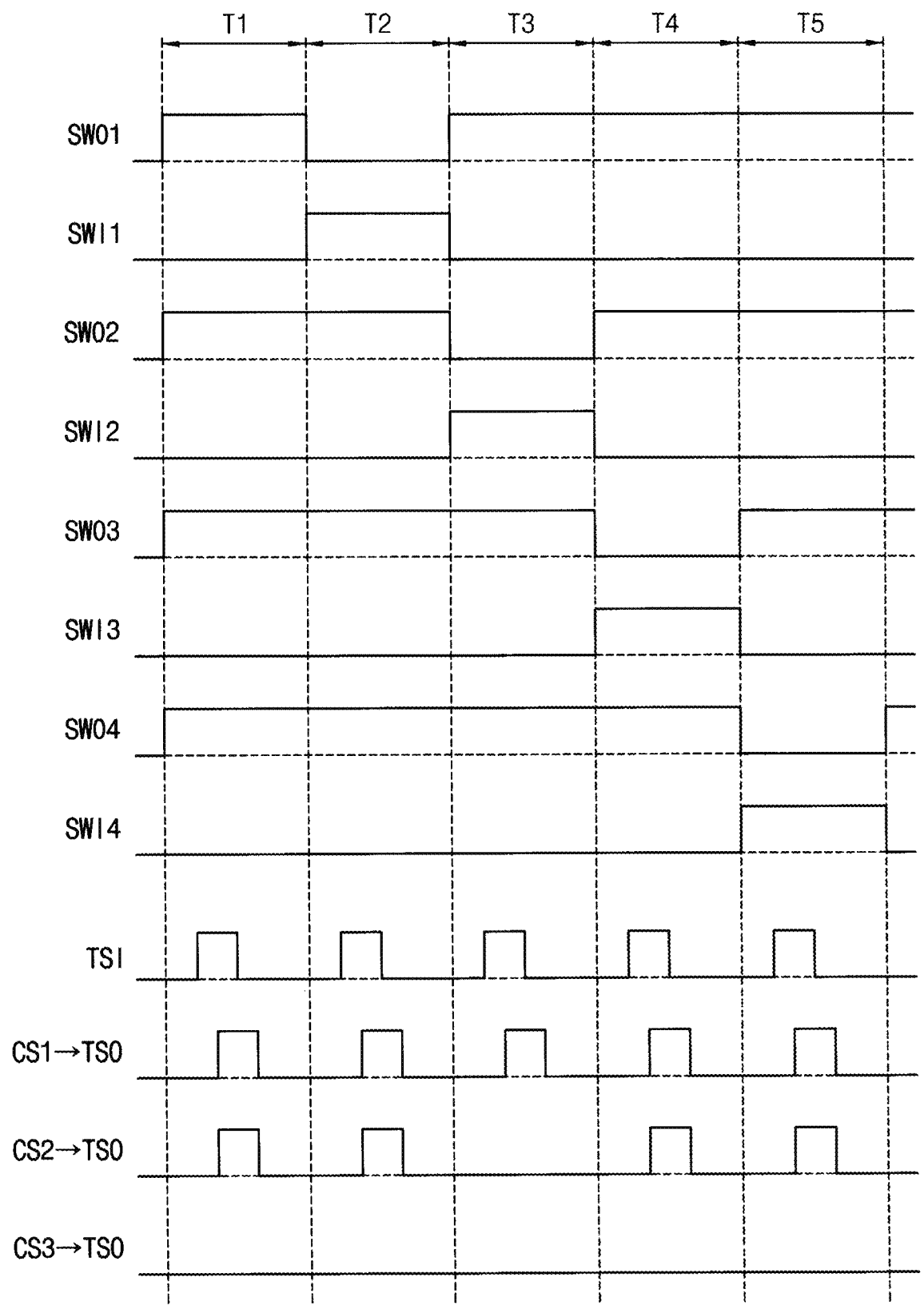

FIGS. 5 and 6 are timing diagrams illustrating an example of signals for detecting a crack in a semiconductor device according to example embodiments.

Referring to FIG. 5, the crack detector 510 in FIG. 4 may compare the phases of the test input signal TSI and the test output signal TSO to measure a delay time or a phase difference between the test input signal TSI and the test output signal TSO. The crack detector 510 may determine the crack occurrence, that is, whether the crack has occurred, based on the delay time.

The crack detector 510 may generate and apply the test input signal TSI including a pulse and may receive the test output signal including the pulse. If the delay time of the test output signal TSO is shorter than a predetermined or alternatively, desired, reference time tRT as a first case CS1, it may be determined that the crack has not occurred. If the delay time of the test output signal TSO is longer than the reference time tRT as a second case CS2, it may be determined that the crack has occurred. If the test output signal TSO does not include the pulse, it may be determined that the conduction path of the crack detection structure is cut completely.

Referring to FIG. 6, the crack occurrence may be detected with respect to different conduction paths during a plurality of test periods T1~T5. In FIG. 6, SWO1~SWO4 indicate the outer connection signals respectively applied to the outer switches of the first through fourth path selection circuits PS1~PS4, and SWI1~SWI4 indicate the inner connection signals respectively applied to the inner switches of the first through fourth path selection circuits PS1~PS4.

The first test period T1 corresponds to the crack detection with respect to a conduction loop including only the outer crack detection structure OCDS. The second test period T2 corresponds to the crack detection with respect to a conduction loop via the first inner crack detection structure ICDS1. The third test period T3 corresponds to the crack detection with respect to a conduction loop via the second inner crack detection structure ICDS2. The fourth test period T4 corresponds to the crack detection with respect to a conduction loop via the third inner crack detection structure ICDS3. The fifth test period T5 corresponds to the crack detection with respect to a conduction loop via the fourth inner crack detection structure ICDS4.

In FIG. 6, a first case CS1 indicates that the crack did not occur with respect to the outer crack detection structure OCDS and the inner crack detection structures ICDS1~ICDS4, a second case CS2 indicates that the crack occurred with respect to the second inner crack detection structure ICDS2, and a third case CS3 indicates that the crack occurred with respect to the outer crack detection structure OCDS.

Through such test method, the crack position in addition to the crack occurrence may be detected efficiently. The detection of the crack position may allow screening of a portion of the semiconductor device 1000 instead of discarding the entire semiconductor device 1000.

Figure 7:
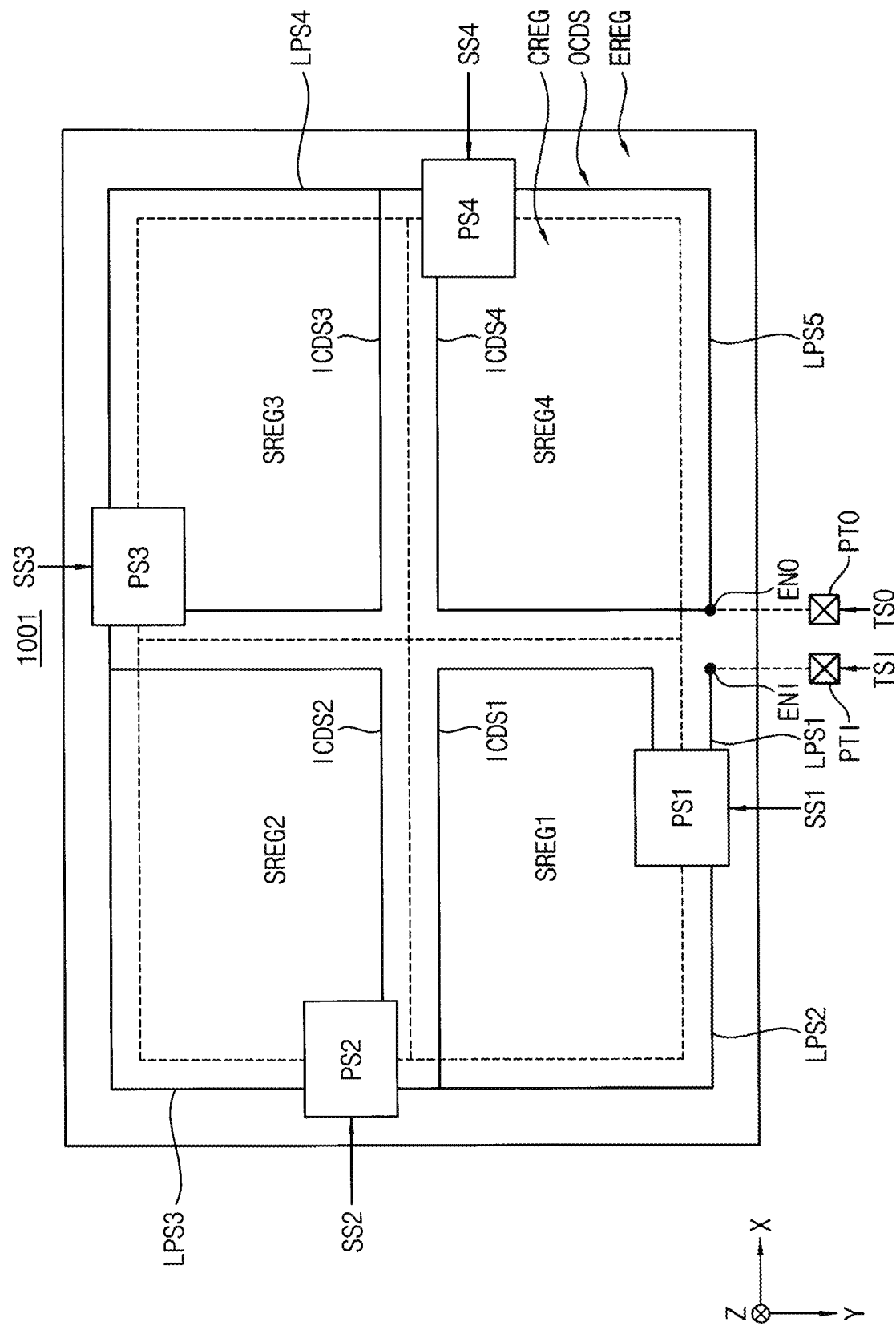
FIG. 7 is a top view illustrating a layout of a semiconductor device according to example embodiments.

FIG. 7 is a top view illustrating a layout of a semiconductor device according to example embodiments.

A semiconductor device 1001 of FIG. 7 is substantially the same as the semiconductor device 1000 of FIG. 1, and the repeated descriptions are omitted. Whereas each inner crack detection structure has a loop shape surrounding each sub region in the semiconductor device 1000 of FIG. 1, each inner crack detection structure may pass only inner portions of each sub region in the semiconductor device 1001 of FIG. 7.

Hereinafter, a direction substantially vertical to the top surface of a substrate is referred to as a first direction or a vertical direction X (or D1), and two directions substantially parallel to the top surface of the substrate and crossing each other are referred to as a second direction X (or D2) and a third direction Y (or D3). For example, the second and third directions X and Y may be perpendicular to each other.

Figure 8:
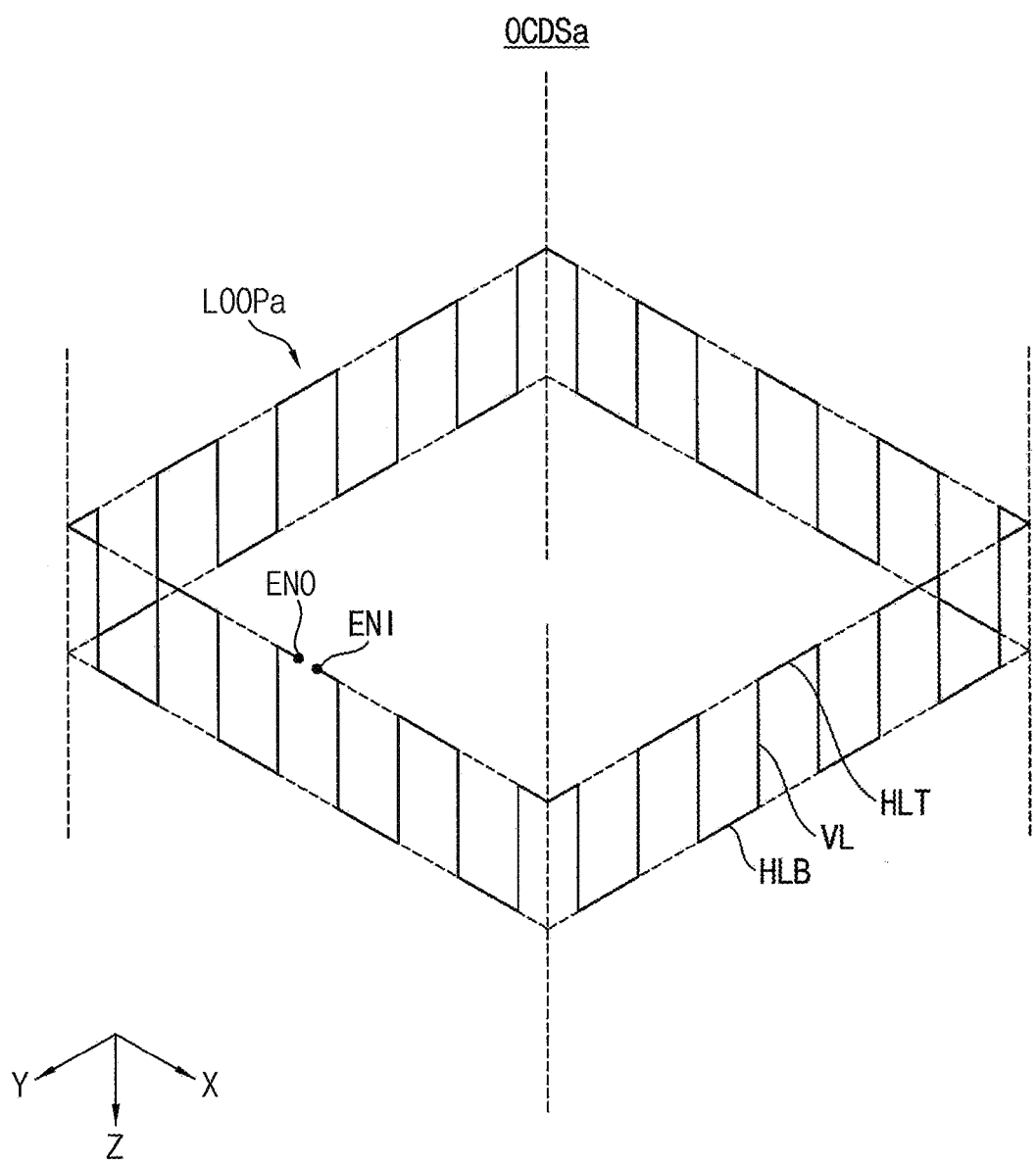
FIG. 8 is a perspective view of a three-dimensional crack detection structure according to example embodiments.

FIG. 8 is a perspective view of a three-dimensional crack detection structure according to example embodiments.

Referring to FIG. 8, a three-dimensional outer crack detection structure OCDSa may include a single conduction loop LOOPa. As will be described below, the semiconductor die may include a first conduction layer and a second conduction layer that is provided under the first conduction layer. The conduction layers may include a metal layer in which metal line segments are patterned and/or a polysilicon layer in which polysilicon line segments are patterned. The outer crack detection structure OCDSa may be expanded in the vertical direction Z through the first conduction layer and the second conduction layer.

The outer crack detection structure OCDSa may include a plurality of top horizontal line segments HLT formed in the first conduction layer, a plurality of bottom horizontal line segments HLB formed in the second conduction layer and a plurality of vertical line segments VL connecting the top horizontal line segments HLT and the bottom horizontal line segments HLB respectively to form the outer crack detection structure OCDSa. The top horizontal line segments HLT, the bottom horizontal line segments HLB and the vertical line segments VL may be disposed alternatively along the outer crack detection structure OCDSa, and may connect an input end node ENI and an output end node ENO in the ring shape to surround the central region of the semiconductor die.

In some example embodiments, the input end node ENI and the output end node ENO may be connected to input-output pads formed on a surface of the semiconductor die so that the outer crack detection structure OCDSa may be connected to an external tester through the input-output pads. In some example embodiments, the input end node ENI and the output end node ENO may be connected to a crack test circuit formed in a portion of the central region of the semiconductor die.

FIGS. 9, 10, 11 and 12 are cross-sectional diagrams illustrating a vertical structure of a three-dimensional crack detection structure according to example embodiments.

Figure 9:
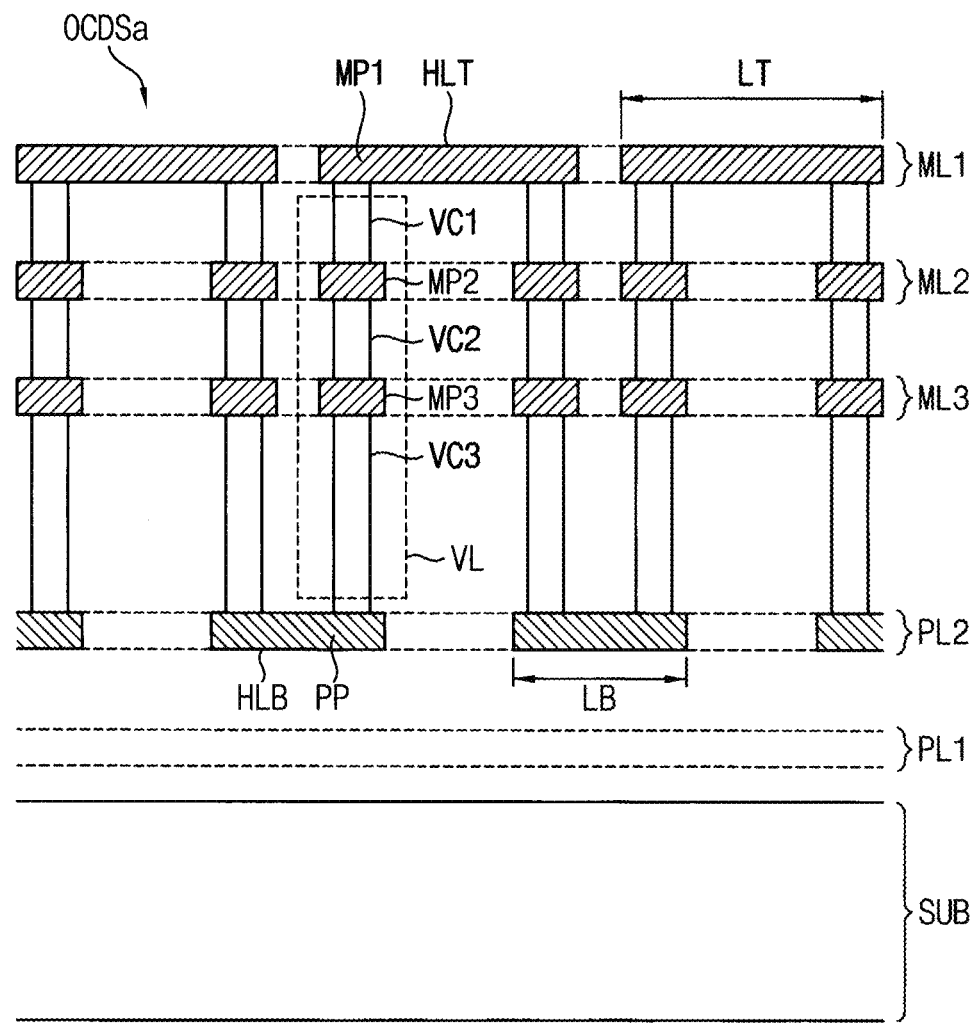
FIGS. 9, 10, 11 and 12 are cross-sectional diagrams illustrating a vertical structure of a three-dimensional crack detection structure according to example embodiments.

Referring to FIG. 9, a semiconductor die may include a semiconductor substrate SUB and a dielectric layer in which upper structures are formed. The dielectric layer may include a plurality of conduction layers ML1, ML2, ML3, PL1 and PL2 in which conduction line patterns are formed. The conduction layers may include one or more metal layers ML1, ML2 and ML3 and one or more polysilicon layers PL1 and PL2. The polysilicon layers may include a polysilicon layer PL1 in which gates of transistors (not shown) in the semiconductor integrated circuit are formed. If the semiconductor integrated circuit is a semiconductor memory device, the polysilicon layers may further include a bitline polysilicon layer PL2 in which bitlines (not shown) in the semiconductor integrated circuit are formed.

The outer crack detection structure OCDSa may include a plurality of top horizontal line segments HLT formed in the first conduction layer ML1, a plurality of bottom horizontal line segments HLB formed in the second conduction layer PL2 and a plurality of vertical line segments VL connecting the top horizontal line segments HLT and the bottom horizontal line segments HLB respectively to form the outer crack detection structure OCDSa.

In embodiments of FIG. 9, the first conduction layer ML1 may correspond to an uppermost metal layer among the metal layer ML1, ML2 and ML3 that are formed over the semiconductor substrate SUB, and the second conduction layer PL2 may correspond to the bitline polysilicon layer that is formed between the semiconductor substrate SUB and the metal layers ML1, ML2 and ML3. The top horizontal line segments HLT may include metal line patterns MP1 formed in the uppermost metal layer ML1, and the bottom horizontal line segments HLB may include polysilicon line patterns PP formed in the bitline polysilicon layer PL2.

The vertical line segments VL may include vertical contacts VC1, VC2 and VC3 to provide an electrical connection between the metal line patterns MP1 in the uppermost metal layer ML1 and the polysilicon line patterns PP in the bitline polysilicon layer PL2. The vertical line segments VL may further include conduction line patterns MP2 and MP3 in the respective intermediate conduction layers ML2 and ML3. In some embodiments, the conduction line pattern in one or both of the intermediate conduction layers ML2 and ML3 may be omitted. For example, the metal line patterns MP2 in the intermediate metal layer ML2 may be omitted, and the two vertical contacts VC1 and VC2 in FIG. 4 may be combined as a longer vertical contact.

Hereinafter, the descriptions repeated with FIG. 9 may be omitted.

Figure 10:
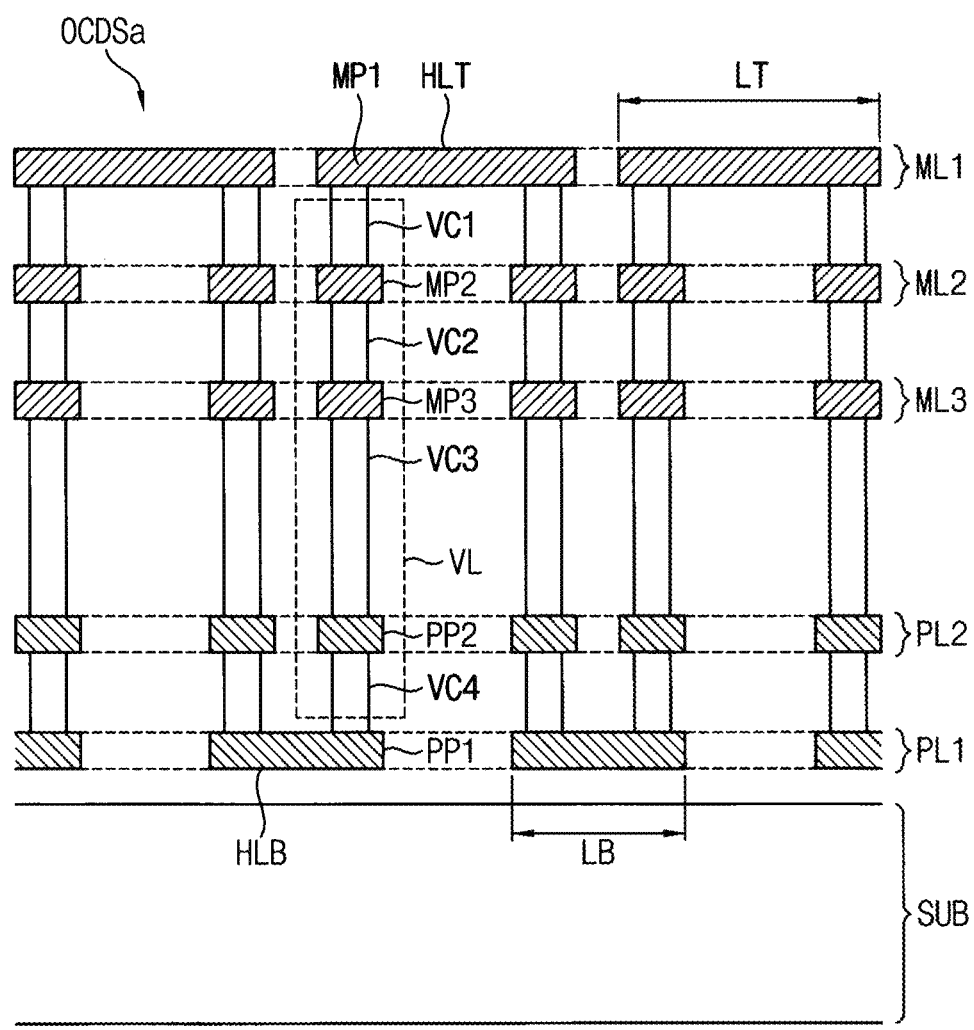

Referring to FIG. 10, the outer crack detection structure OCDSa may include a plurality of top horizontal line segments HLT formed in the first conduction layer ML1, a plurality of bottom horizontal line segments HLB formed in the second conduction layer PL1, and a plurality of vertical line segments VL connecting the top horizontal line segments HLT and the bottom horizontal line segments HLB respectively to form the outer crack detection structure OCDSa.

In the embodiment of FIG. 10, the first conduction layer ML1 may correspond to an uppermost metal layer among the metal layers ML1, ML2 and ML3 that are formed over the semiconductor substrate SUB, and the second conduction layer PL1 may correspond to the gate polysilicon layer that is formed between the semiconductor substrate SUB and the metal layers ML1, ML2 and ML3. The top horizontal line segments HLT may include metal line patterns MP1 formed in the uppermost metal layer ML1, and the bottom horizontal line segments HLB may include polysilicon line patterns PP1 formed in the gate polysilicon layer PL1.

Figure 11:
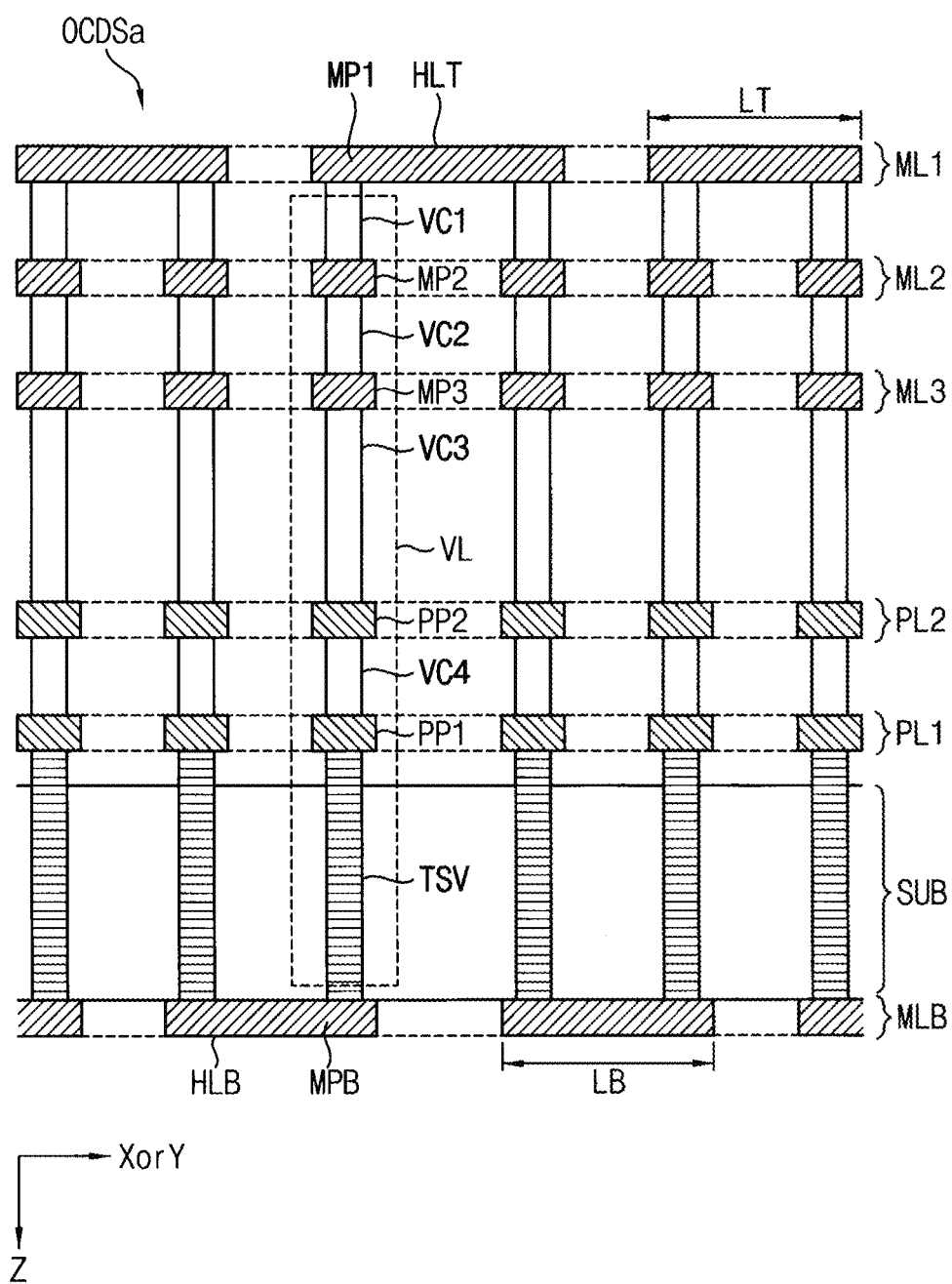

Referring to FIG. 11, the outer crack detection structure OCDSa may include a plurality of top horizontal line segments HLT formed in the first conduction layer ML1, a plurality of bottom horizontal line segments HLB formed in the second conduction layer MLB, and a plurality of vertical line segments VL connecting the top horizontal line segments HLT and the bottom horizontal line segments HLB respectively to form the outer crack detection structure OCDSa.

In the embodiment of FIG. 11, the first conduction layer ML1 may correspond to an uppermost metal layer among the metal layers ML1, ML2 and ML3 that are formed over the semiconductor substrate SUB, and the second conduction layer MLB may correspond to a metal layer that is formed on a bottom surface of the semiconductor substrate SUB. The top horizontal line segments HLT may include metal line patterns MP1 formed in the uppermost metal layer ML1, and the bottom horizontal line segments HLB may include metal line patterns MPB formed in the metal layer MLB on the bottom surface of the semiconductor substrate SUB.

As described with reference to FIGS. 9, 10 and 11, the three-dimensional crack detection structure according to example embodiments may be expanded in the vertical direction Z to the various depths. Using the three-dimensional crack detection structure, the crack penetration of various types may be detected more thoroughly.

Figure 12:
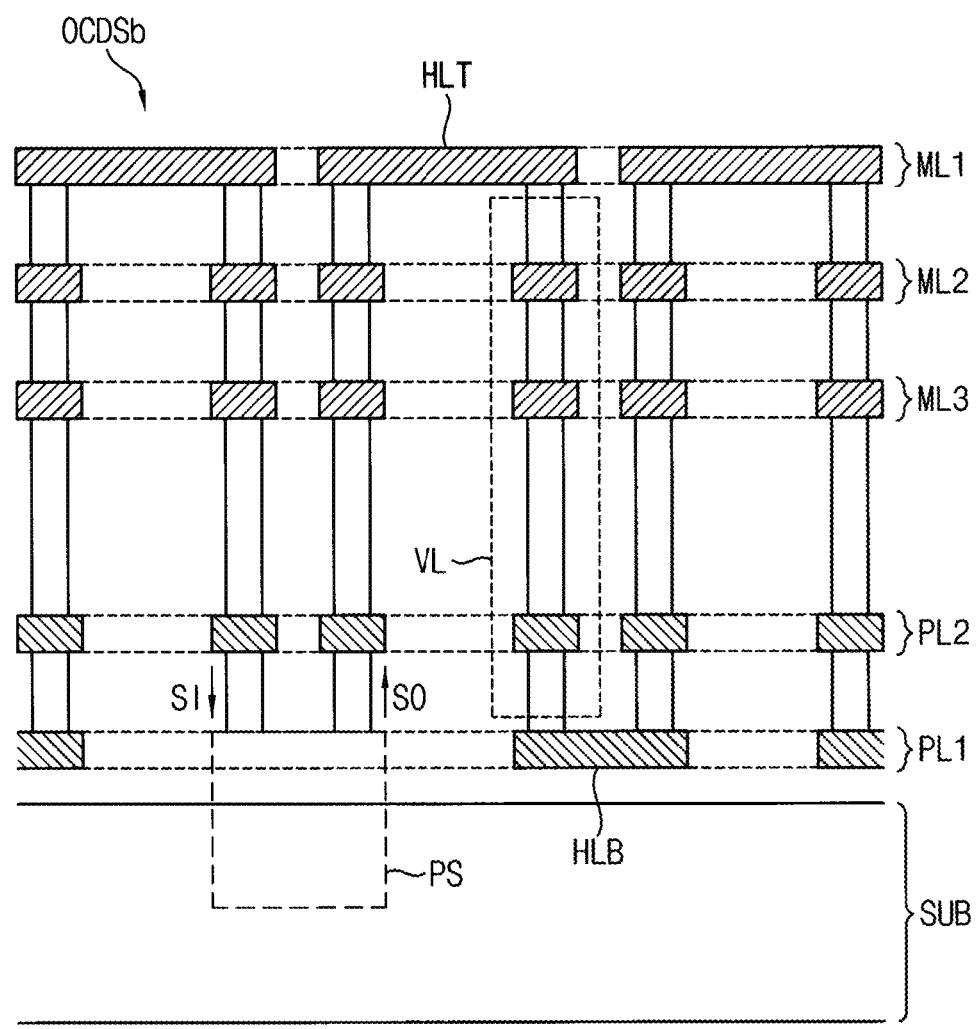

Compared with the outer crack detection structure OCDSa of FIG. 10, a portion of the bottom horizontal line segments HLB in the gate polysilicon layer PL1 may be omitted and a path selection circuit PS may be formed in the omitted region as illustrated in FIG. 12. The path selection circuit PS may include transistors formed using the semiconductor substrate SUB and the transistors may be used as the switches as described above.

Figure 13:
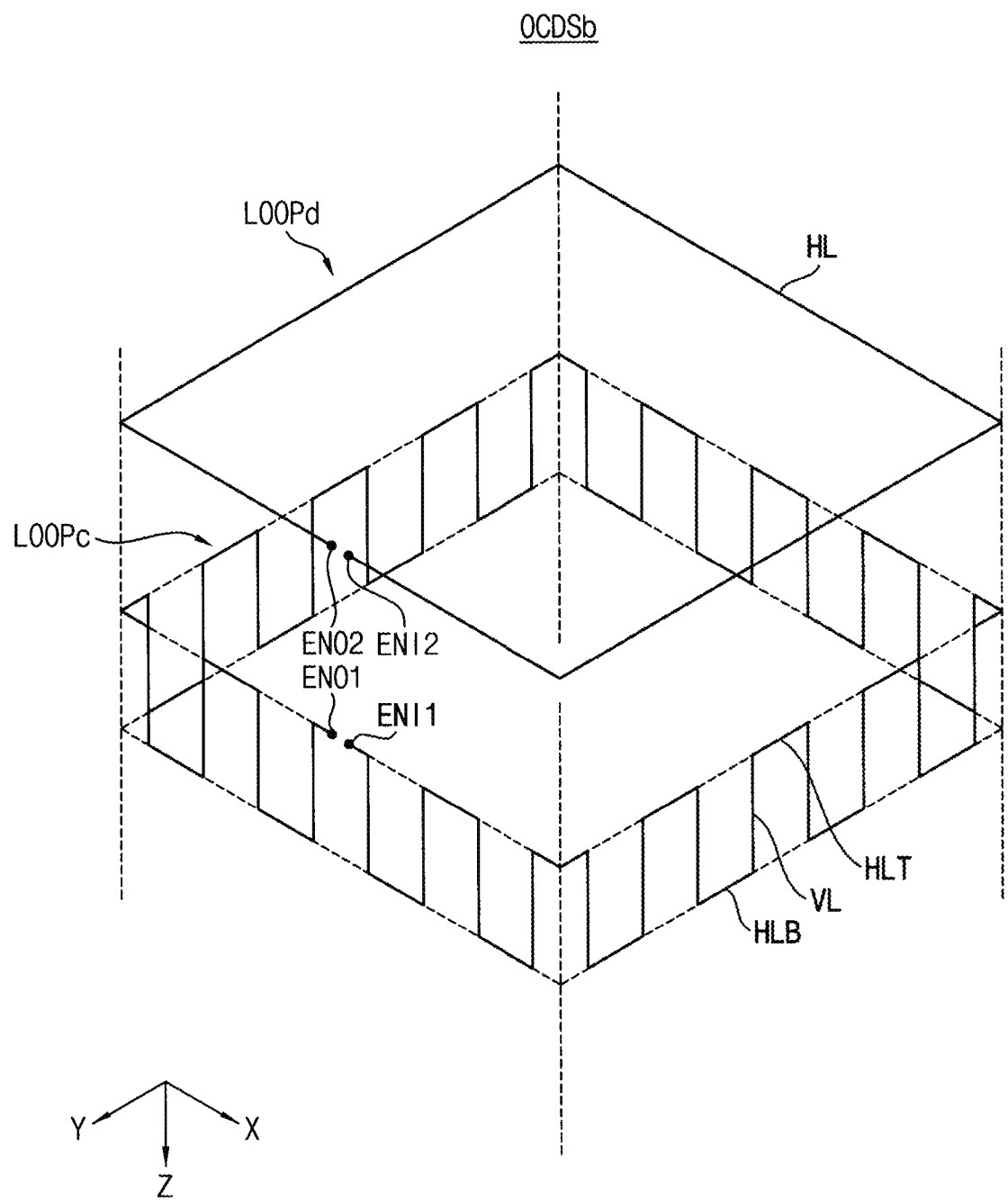
FIG. 13 is a perspective view of a three-dimensional crack detection structure according to example embodiments.

FIG. 13 is a perspective view of a three-dimensional crack detection structure according to example embodiments.

Referring to FIG. 13, a three-dimensional outer crack detection structure OCDSb may include a first conduction loop LOOPc and a second conduction loop LOOPd. As will be described below, the semiconductor die may include a first conduction layer, a second conduction layer under the first conduction layer, and a third conduction layer under the second conduction layer. The conduction layers may include a metal layer in which metal line segments are patterned and/or a polysilicon layer in which polysilicon line segments are patterned. The first conduction loop LOOPc may be expanded in the vertical direction Z between the second conduction layer and the third conduction layer in a three-dimensional shape. The second conduction loop LOOPd may be formed in the first conduction layer in a two-dimensional shape.

The first conduction loop LOOPc may include a plurality of first top horizontal line segments HLT formed in the second conduction layer, a plurality of bottom horizontal line segments HLB formed in the third conduction layer and a plurality of vertical line segments VL connecting the first top horizontal line segments HLT and the bottom horizontal line segments HLB respectively to form the first conduction loop LOOPc. The second conduction loop LOOPd may include a plurality of second top horizontal line segments HL formed on the first conduction layer. The first top horizontal line segments HLT, the bottom horizontal line segments HLB and the vertical line segments VL may be disposed alternatively along the first conduction loop LOOPc and connect a first input end node ENI1 and a first output end node ENO1 in a ring shape to surround the central region of the semiconductor die. The second top horizontal line segments HL may connect a second input end node ENI2 and a second output end node ENI2 in a ring shape to surround the central region of the semiconductor die.

In some example embodiments, the input end nodes ENI1 and ENI2 and the output end nodes ENO1 and ENO2 may be connected to input-output pads formed on a surface of the semiconductor die so that the conduction loops LOOPc and LOOPd may be connected to an external tester through the input-output pads. In some example embodiments, the input end nodes ENI1 and ENI2 and the output end nodes ENO1 and ENO2 may be connected to a crack test circuit such as a crack detector formed in a portion of the central region of the semiconductor die.

Figure 14:
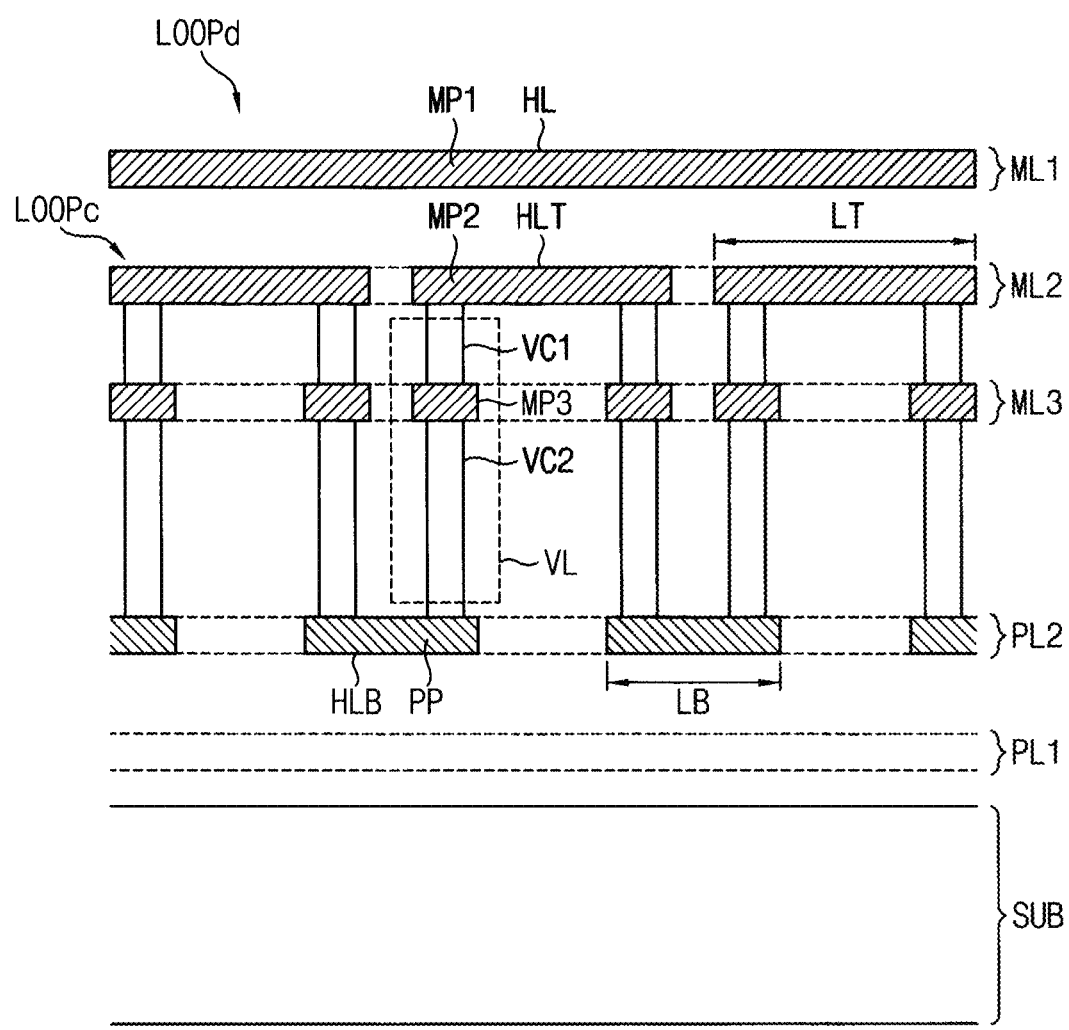
FIGS. 14 and 15 are cross-sectional diagrams illustrating a vertical structure of a three-dimensional crack detection structure according to example embodiments.
Figure 15:
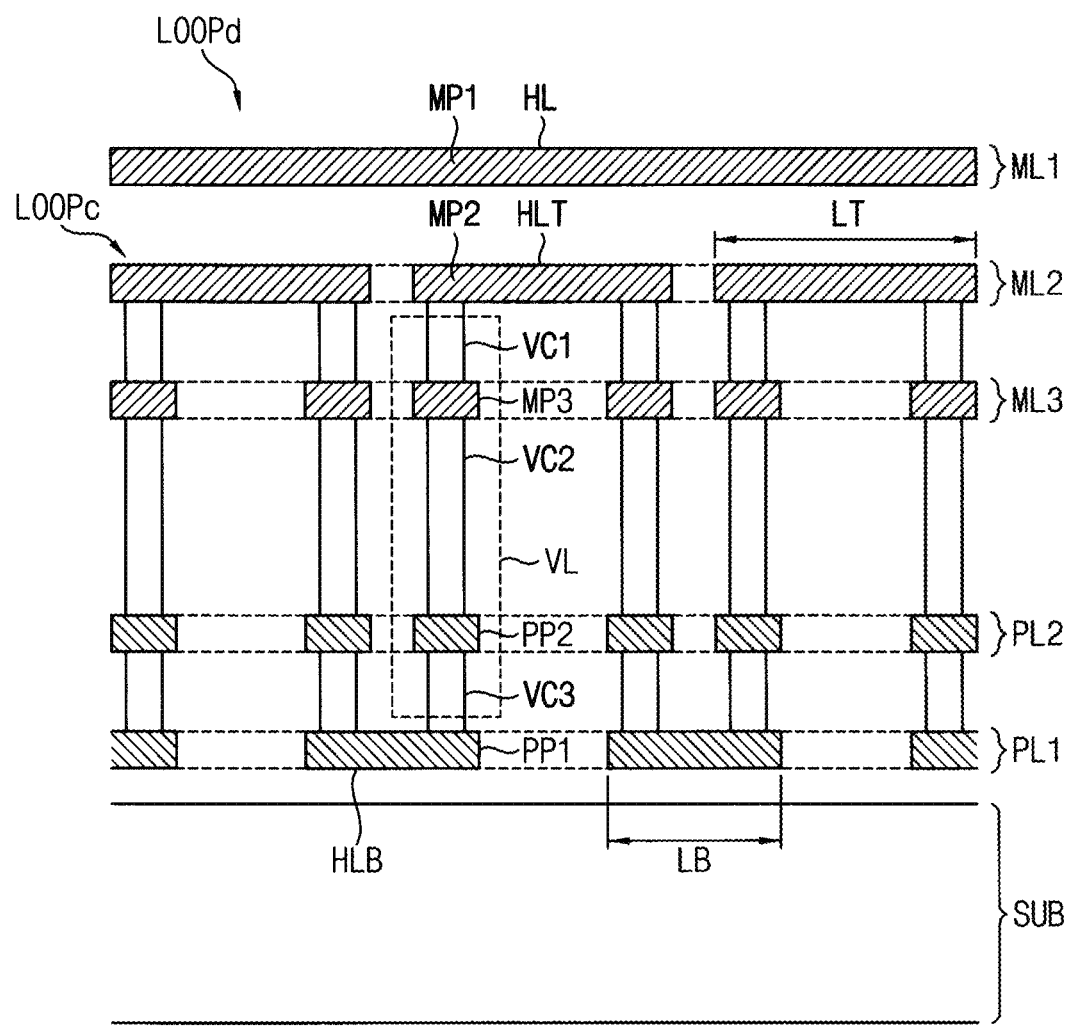

FIGS. 14 and 15 are cross-sectional diagrams illustrating a vertical structure of a three-dimensional crack detection structure according to example embodiments. Hereinafter, the descriptions repeated with FIGS. 8 through 13 may be omitted.

Referring to FIG. 14, the first conduction loop LOOPc may include a plurality of first top horizontal line segments HLT formed in the second conduction layer ML2, a plurality of bottom horizontal line segments HLB formed in the second conduction layer PL2 and a plurality of vertical line segments VL connecting the first top horizontal line segments HLT and the bottom horizontal line segments HLB respectively to form the first conduction loop LOOPc. The second conduction loop LOOPd may include a plurality of second top horizontal line segments HL formed in the first conduction layer ML1 over the second conduction layer ML2.

In the embodiment of FIG. 14, the first conduction layer ML1 may correspond to an uppermost metal layer among the metal layer ML1, ML2 and ML3 that are formed over the semiconductor substrate SUB, the second conduction layer ML2 may be a metal layer under the uppermost metal layer ML1, and the third conduction layer PL2 may correspond to the bitline polysilicon layer that is formed between the semiconductor substrate SUB and the metal layers ML1, ML2 and ML3. The first top horizontal line segments HLT may include metal line patterns MP2 formed in the second metal layer ML2, and the bottom horizontal line segments HLB may include polysilicon line patterns PP formed in the bitline polysilicon layer PL2. The second top horizontal line segments HL may include metal line patterns MP1 formed in the first metal layer ML1.

Referring to FIG. 15, the first conduction loop LOOPc may include a plurality of first top horizontal line segments HLT formed in the second conduction layer ML2, a plurality of bottom horizontal line segments HLB formed in the second conduction layer PL1 and a plurality of vertical line segments VL connecting the first top horizontal line segments HLT and the bottom horizontal line segments HLB respectively to form the first conduction loop LOOPc. The second conduction loop LOOPd may include a plurality of second top horizontal line segments HL formed in the first conduction layer ML1 over the second conduction layer ML2.

In the embodiment of FIG. 15, the first conduction layer ML1 may correspond to an uppermost metal layer among the metal layer ML1, ML2 and ML3 that are formed over the semiconductor substrate SUB, the second conduction layer ML2 may be a metal layer under the uppermost metal layer ML1, and the third conduction layer PL1 may correspond to the gate polysilicon layer that is formed between the semiconductor substrate SUB and the metal layers ML1, ML2 and ML3. The first top horizontal line segments HLT may include metal line patterns MP2 formed in the metal layer ML2, and the bottom horizontal line segments HLB may include polysilicon line patterns PP1 formed in the gate polysilicon layer PL1. The second top horizontal line segments HL may include metal line patterns MP1 formed in the first metal layer ML1.

As described with reference to FIGS. 14 and 15, the three-dimensional crack detection structure according to example embodiments may be expanded in the vertical direction Z to the various depths. Using the three-dimensional crack detection structure, the crack penetration of various types may be detected more thoroughly.

Figure 16:
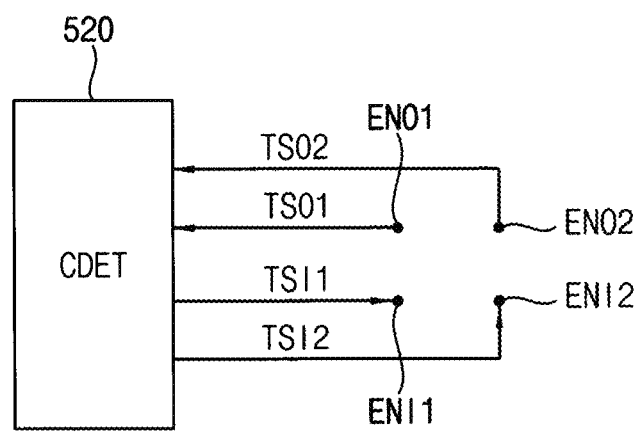
FIG. 16 is a diagram for describing a method of detecting a crack in a semiconductor device according to example embodiments.

FIG. 16 is a diagram for describing a method of detecting a crack in a semiconductor device according to example embodiments.

The semiconductor device may include a three-dimensional crack detection structure, e.g., the first conduction loop LOOPc and the second conduction loop LOOPd, as described above.

As described above, the crack detector CDET 520 may be included in an external tester or in an internal circuit of the semiconductor device. The crack detector 520 may apply the first test input signal TSB to the first input end node ENI1 and then receive the first test output signal TSO through the first output end node ENI1. Also, the crack detector 520 may apply the second test input signal TSI2 to the second input end node ENI2 and then receive the second test output signal TSO2 through the second output end node ENI2.

The first test output signal TSO1 corresponds to the first test input signal TSI1 after passing through the first conduction loop LOOPc, and the second test output signal TSO2 corresponds to the second test input signal TSI2 after passing through the second conduction loop LOOPd. The crack detector 520 may determine the crack occurrence by comparing the first test input signal TSI1 and the first test output signal TSO1 and by comparing the second test input signal TSI2 and the second test output signal TSO2.

Figure 17:
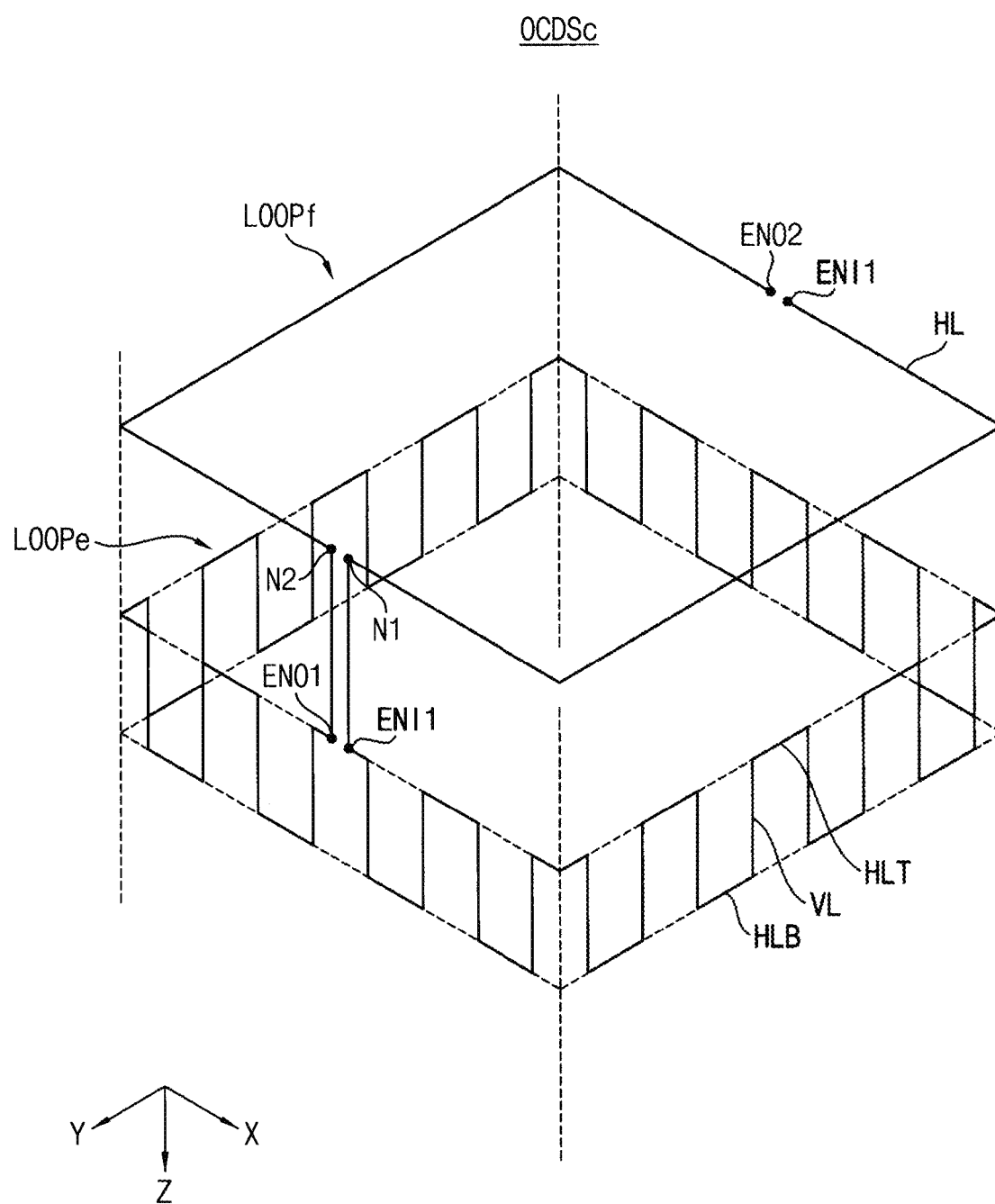
FIG. 17 is a perspective view of a three-dimensional crack detection structure according to example embodiments.

FIG. 17 is a perspective view of a three-dimensional crack detection structure according to example embodiments.

Referring to FIG. 17, a three-dimensional outer crack detection structure OCDSc may include a first conduction loop LOOPe and a second conduction loop LOOPf. As described above, the semiconductor die may include a first conduction layer, a second conduction layer under the first conduction layer and a third conduction layer under the second conduction layer. The conduction layers may include a metal layer in which metal line segments are patterned and/or a polysilicon layer in which polysilicon line segments are patterned. The first conduction loop LOOPe may be expanded in the vertical direction Z between the second conduction layer and the third conduction layer in a three-dimensional shape. The second conduction loop LOOPf may be formed in the first conduction layer in a two-dimensional shape.

The first conduction loop LOOPe may include a plurality of first top horizontal line segments HLT formed in the second conduction layer, a plurality of bottom horizontal line segments HLB formed in the third conduction layer and a plurality of vertical line segments VL connecting the first top horizontal line segments HLT and the bottom horizontal line segments HLB respectively to form the first conduction loop LOOPe. The second conduction loop LOOPf may include a plurality of second top horizontal line segments HL formed on the first conduction layer. The first top horizontal line segments HLT, the bottom horizontal line segments HLB and the vertical line segments VL may be disposed alternatively along the first conduction loop LOOPe and connect a first input end node ENI1 and a first output end node ENO1 in a ring shape to surround the central region of the semiconductor die. The second top horizontal line segments HL may connect a second input end node ENI2 and a second output end node ENI2 in a ring shape to surround the central region of the semiconductor die. As illustrated in FIG. 17, the end nodes ENI1 and ENO2 of the first conduction loop LOOPe may be connected to intermediate nodes of the second conduction loop LOOPf such that the first and second conduction loops LOOPe and LOOPf may form a combined conduction loop.

In some example embodiments, the second input end node ENI2 and the second output end node ENO2 may be connected to input-output pads formed on a surface of the semiconductor die so that the combined conduction loop may be connected to an external tester through the input-output pads. In some example embodiments, the second input end node ENI2 and the second output end node ENO2 may be connected to a crack test circuit such as a crack detector formed in a portion of the central region of the semiconductor die.

Figure 18:
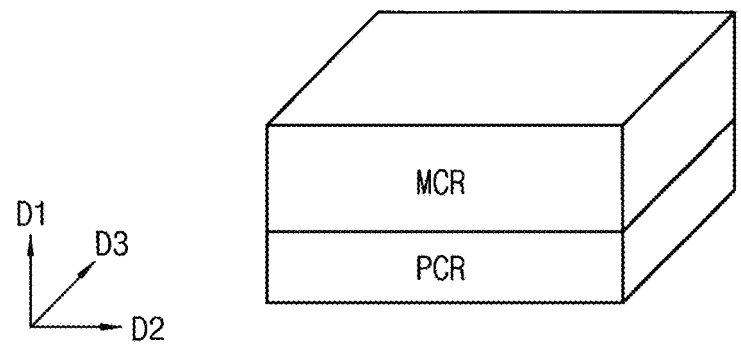
FIG. 18 is a perspective view of a nonvolatile memory device according to example embodiments.

FIG. 18 is a perspective view of a nonvolatile memory device according to example embodiments.

Referring to FIG. 18, a nonvolatile memory device may include a peripheral circuit region PCR in which a peripheral circuit is formed and a memory cell region MCR in which a memory cell array is formed.

The peripheral circuit region PCR may include a semiconductor substrate and a peripheral circuit formed at the semiconductor substrate, as will be described below. The elements shown in FIG. 19 (other than the memory cell array 100) may be formed in the peripheral circuit region PCR. The memory cell region MCR may include a memory cell array. As such, a size of the nonvolatile memory device may be reduced by adopting a cell over periphery (COP) structure, as will be described below, in which the peripheral circuit is formed on the semiconductor substrate and the memory cell array is stacked on the peripheral circuit.

Figure 19:
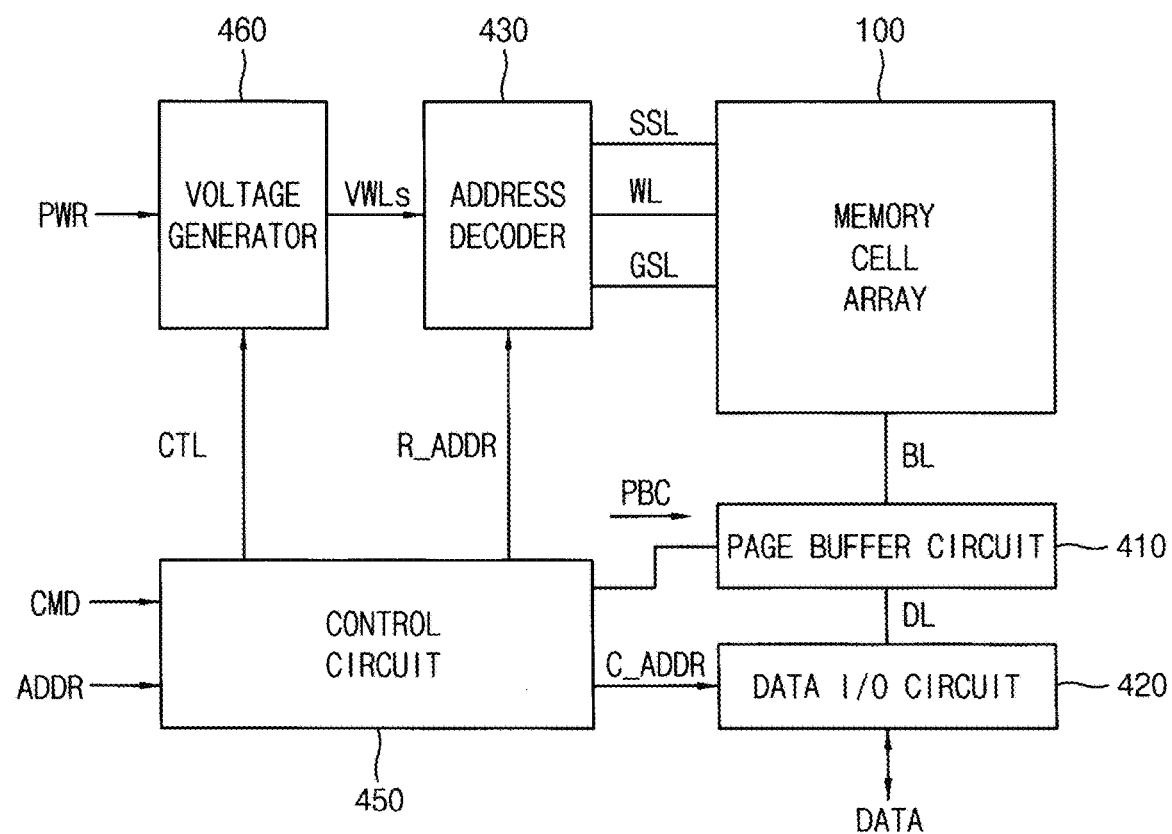
FIG. 19 is a block diagram illustrating a nonvolatile memory device according to example embodiments.

FIG. 19 is a block diagram illustrating a nonvolatile memory device according to example embodiments.

Referring to FIG. 19, a nonvolatile memory device 30 may include a memory cell array 100, a page buffer circuit 410, a data input/output (I/O) circuit 420, an address decoder 430, a control circuit 450, and/or a voltage generator 460.

The memory cell array 100 may be coupled to the address decoder 430 through a plurality of string selection lines SSL, a plurality of word lines WL, and a plurality of ground selection lines GSL. In addition, the memory cell array 100 may be coupled to the page buffer circuit 410 through a plurality of bit lines BL.

The memory cell array 100 may include a plurality of memory cells coupled to the plurality of word lines WL and the plurality of bit lines BL. In an exemplary embodiment of the inventive concept, the memory cell array 100 may be a three-dimensional memory cell array, which is formed on a substrate in a three-dimensional structure (or a vertical structure). In this case, the memory cell array 100 may include a plurality of NAND strings that are vertically oriented such that at least one memory cell is located over another memory cell.

The control circuit 450 may receive a command (signal) CMD and an address (signal) ADDR from the memory controller 20 and control erasure, programming, and read operations of the nonvolatile memory device 30 based on the command signal CMD and the address signal ADDR. An erasure operation may comprise performing a sequence of erase loops, and a program operation may include performing a sequence of program loops. Each erase loop may include an erase operation and an erase verification operation. Each program loop may include a program operation and a program verification operation. The read operation may include a normal read operation and a data recover read operation.

For example, the control circuit 450 may generate control signals CTL, which are used for controlling the voltage generator 460, and may generate a page buffer control signal PBC for controlling the page buffer circuit 410, based on the command signal CMD, and generate a row address R_ADDR and a column address C_ADDR based on the address signal ADDR. The control circuit 450 may provide the row address R_ADDR to the address decoder 430 and provide the column address C_ADDR to the data input/output circuit 420.

The address decoder 430 may be coupled to the memory cell array 100 through the plurality of string selection lines SSL, the plurality of word lines WL, and the plurality of ground selection lines GSL. During the program operation or the read operation, the address decoder 430 may determine one of the plurality of word lines WL as a selected word line and determine the rest of the plurality of word lines WL except for the selected word line as unselected word lines, based on the row address R_ADDR.

In addition, during the program operation or the read operation, the address decoder 430 may determine one of the plurality of string selection lines SSL as a selected string selection line and determine the rest of the plurality of string selection lines SSL except for the selected string selection line as unselected string selection lines, based on the row address R_ADDR.

The voltage generator 460 may generate word line voltages VWL for the operation of the memory cell array 100 of the nonvolatile memory device 30, based on the control signals CTL. The voltage generator 460 may receive power PWR from the memory controller 20. The word line voltages VWL may be applied to the plurality of word lines WL through the address decoder 430.

For example, during the program operation, the voltage generator 460 may apply a program voltage to the selected word line and may apply a program pass voltage to the unselected word lines. In addition, during the program verification operation, the voltage generator 460 may apply a program verification voltage to the selected word line and may apply a verification pass voltage to the unselected word lines.

In addition, during the normal read operation, the voltage generator 460 may apply a read voltage to the selected word line and may apply a read pass voltage to the unselected word lines. During the data recover read operation, the voltage generator 460 may apply the read voltage to a word line adjacent to the selected word line and may apply a recover read voltage to the selected word line.

The page buffer circuit 410 may be coupled to the memory cell array 100 through the plurality of bit lines BL. The page buffer circuit 410 may include a plurality of buffers. In some example embodiments, each buffer may be connected to only one bit line. In other example embodiments, each buffer may be connected to two or more bit lines.

The page buffer circuit 410 may temporarily store data to be programmed in a selected page or data read out from the selected page of the memory cell array 100.

The data input/output circuit 420 may be coupled to the page buffer circuit 410 through data lines DL. During the program operation, the data input/output circuit 420 may receive program data DATA received from the memory controller 20 and provide the program data DATA to the page buffer circuit 410 based on the column address C_ADDR received from the control circuit 450. During the read operation, the data input/output circuit 420 may provide read data DATA, having been read from the memory cell array 100 and stored in the page buffer circuit 410, to the memory controller 20 based on the column address C_ADDR received from the control circuit 450.

In addition, the page buffer circuit 410 and the data input/output circuit 420 may read data from a first area of the memory cell array 100 and write this read data to a second area of the memory cell array 100 (e.g., without transmitting the data to a source external to the nonvolatile memory device 30, such as to the memory controller 20). In other words, the page buffer circuit 410 and the data input/output circuit 420 may perform a copy-back operation.

One or more elements of FIG. 19 may be implemented by processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Figure 20:
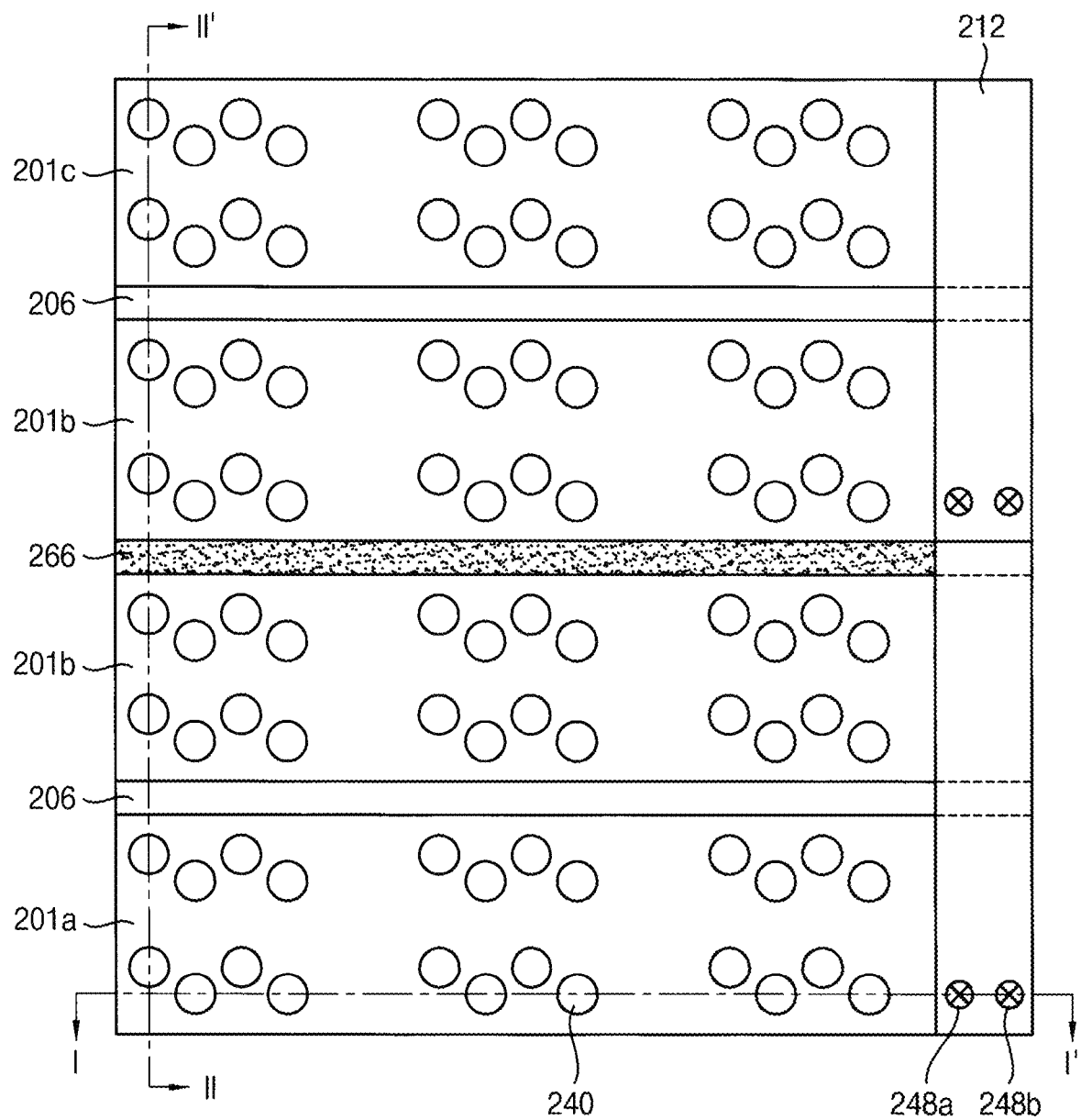
FIG. 20 is a top view of a nonvolatile memory device according to example embodiments.
Figure 21:
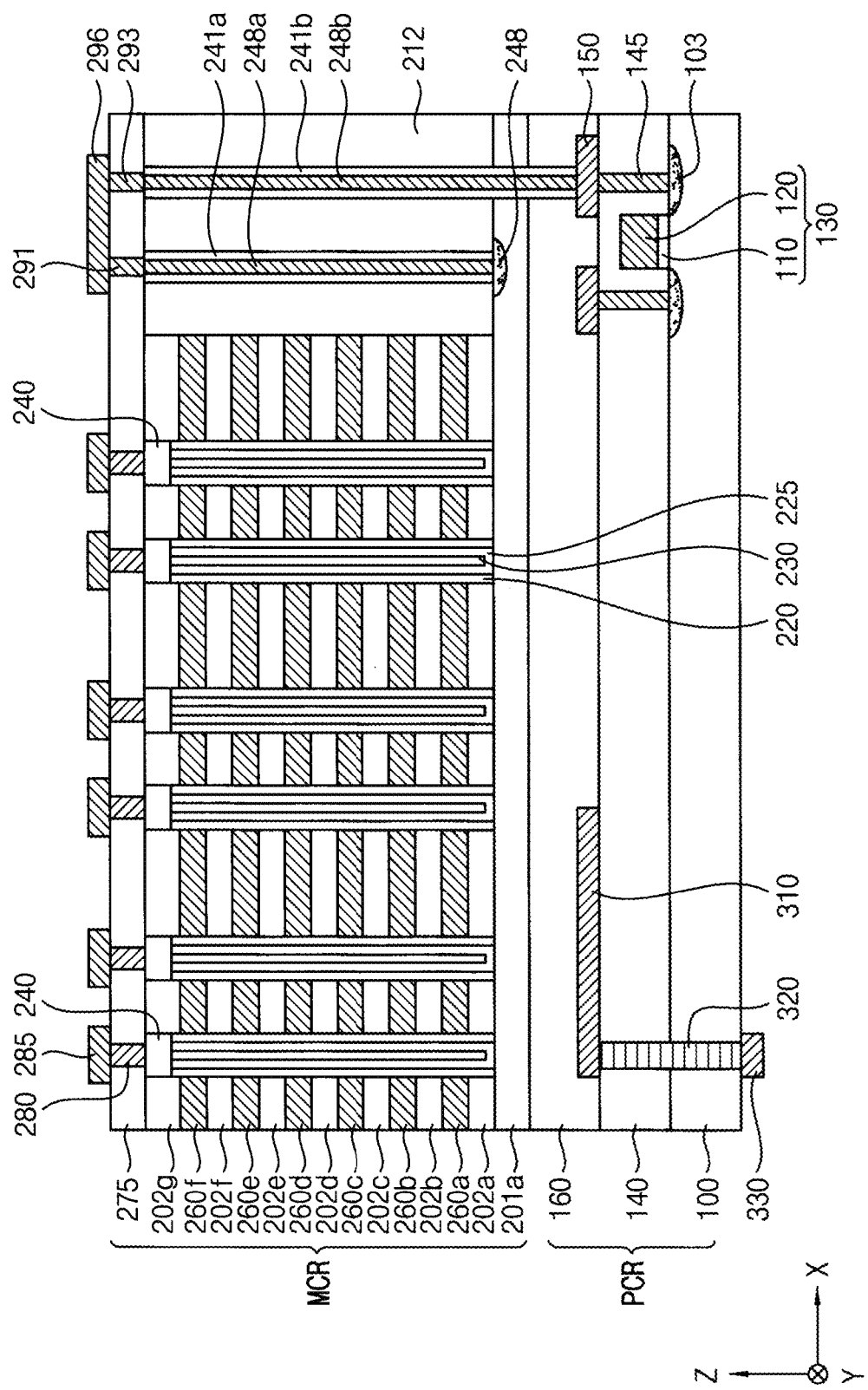
FIG. 21 is a cross-sectional view taken along a line I-I' in FIG. 20.
Figure 22:
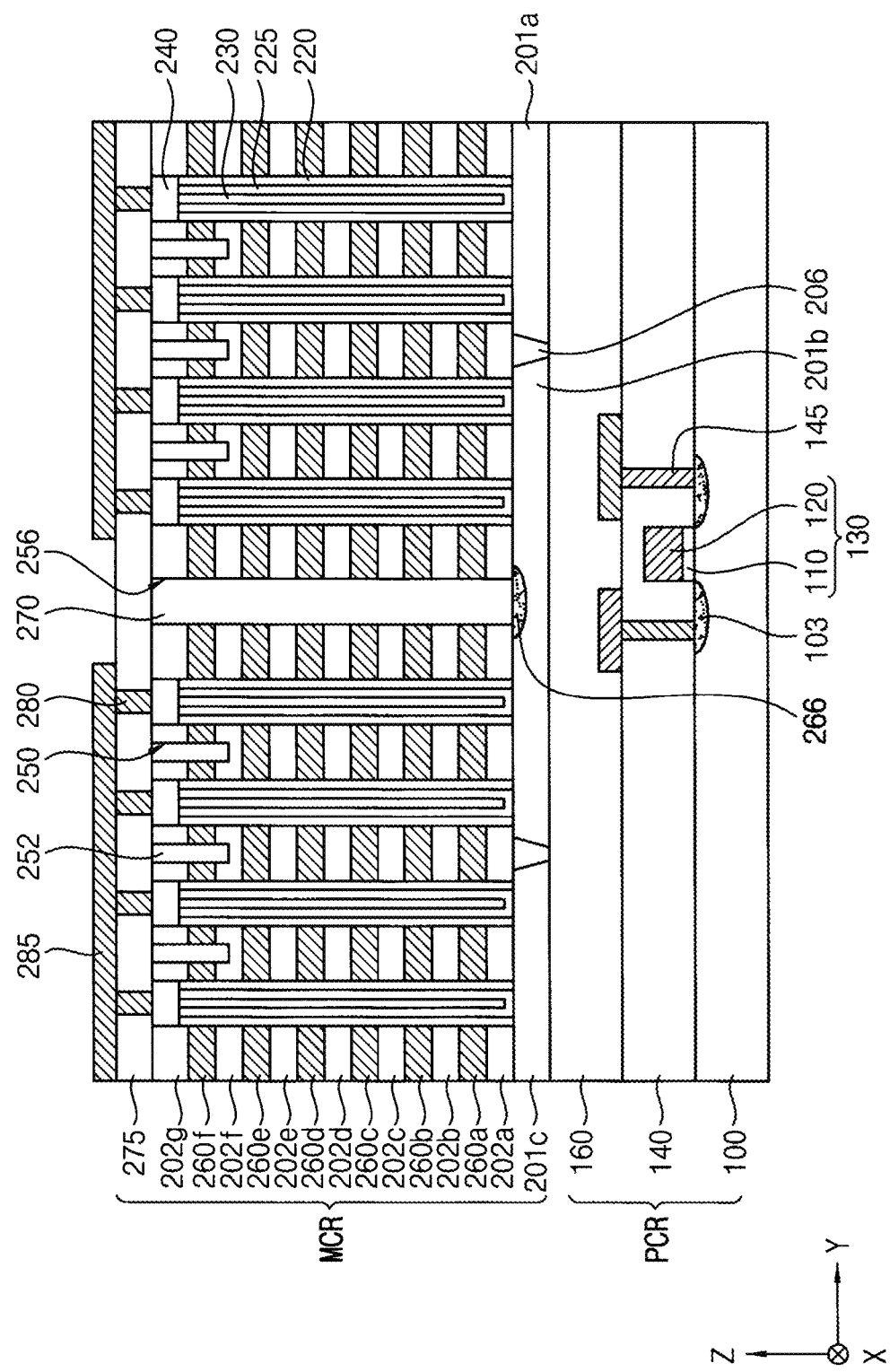
FIG. 22 is a cross-sectional view taken along a line II-II' in FIG. 20.

FIG. 20 is a top view of a nonvolatile memory device according to example embodiments, FIG. 21 is a cross-sectional view taken along a line I-I' in FIG. 20, and FIG. 22 is a cross-sectional view taken along a line II-II' in FIG. 20.

In some example embodiments, a non-volatile memory device may have a cell over periphery (COP) structure in which a memory cell structure is stacked on a peripheral circuit. The memory cell structure may have a vertical NAND flash memory device structure in which a plurality of NAND flash memory cells are formed vertically, e.g., in the first direction D1, with respect to a top surface of a substrate.

For a clear and concise description, some elements of the memory device are not shown in FIG. 20. For example, FIG. 20 illustrates base layer patterns 201a, 201b, and 201c, separation layer patterns 206, a second impurity region 266, a mold protection layer 212, a first connecting contact 248a, and a second connecting contact 248b, and the other elements described above are omitted.

Referring to FIGS. 20 through 22, the memory device may include a peripheral circuit structure formed in the peripheral circuit region PCR and a memory cell structure formed in the memory cell region MCR including.

The peripheral circuit may include, e.g., a transistor including a gate structure 130 and a source/drain region 103 formed on a substrate 100, lower insulation layers 140 and 160, a lower contact 145, and/or lower wirings 150 and 310.

The substrate 100 may include a semiconductor material, e.g., single crystalline silicon or single crystalline germanium. The gate structure 130 may include a gate insulation layer pattern 110 and a gate electrode 120, which are stacked on the substrate 100. The transistor may be disposed on the substrate 100.

The gate insulation layer pattern 110 may include, e.g., silicon oxide or a metal oxide. The gate electrode 120 may include, e.g., a metal, a metal nitride, or doped polysilicon. The source/drain region 103 may include n-type or p-type impurities.

A first lower insulation layer 140 may be formed on the substrate 100 to cover a structure such as the transistor, and the lower contact 145 may extend through the first lower insulation layer 140 to be electrically connected to the source/drain region 103.

The lower wirings 150 and 310 may be disposed on the first lower insulation layer 140, and may be electrically connected to the lower contact 145 and a through-substrate via 320, respectively. A second lower insulation layer 160 may be formed on the first lower insulation layer 140 to cover the lower wirings 150 and 310. FIG. 20 illustrates a non-limiting example where the lower wirings 150 and 310 are formed in the same layer, but the lower wirings 150 and 310 may be distributed in different wiring layers, as will be described below with reference to FIG. 21.

The first and second lower insulation layers 140 and 160 may include an insulating material, e.g., silicon oxide. The lower contact 145 and the lower wirings 150 and 310 may include, e.g., a metal, a metal nitride, or doped polysilicon.

The memory cell structure may include first to third base layer patterns 201a, 201b, and 201c, a channel 225, a gate line 260, a bit line 285, and a connecting wiring 296, etc.

The separation layer pattern 206 may extend in the second direction D2, and a plurality of the separation layer patterns 206 may be arranged along the third direction D3. Thus, a base layer may be physically divided into the first to third base layer patterns 201a, 201b, and 201c. FIGS. 20 through 22 illustrate three base layer patterns 201a, 201b and 201c; however, the number of base layer patterns is not limited thereto.

The base layer patterns 201a, 201b, and 201c may include polysilicon or single crystalline silicon. In some embodiments, the base layer patterns 201a, 201b, and 201c may further include p-type impurities such as boron (B). In this case, the base layer patterns 201a, 201b, and 201c may serve as a p-type well.

The separation layer pattern 206 may be extended linearly in the second direction D2. The base layer patterns 201a, 201b, and 201c may be physically separated by the separation layer pattern 206. The separation layer pattern 206 may include an insulation layer pattern, e.g., silicon oxide.

The channel 225 may be disposed on the base layer patterns 201a, 201b, and 201c, and may extend in the first direction D1 from top surfaces of the base layer patterns 201a, 201b, and 201c. The channel 225 may have a hollow cylindrical shape or a cup shape. The channel 225 may include polysilicon or single crystalline silicon, and may include an impurity region doped with, e.g., p-type impurities such as boron.

A plurality of the channels 225 may be arranged in the second direction D2 to form a channel row, and a plurality of the channel rows may be arranged in the third direction D3. In some example embodiments, the channels 225 included in the neighboring channel rows may be arranged in a zigzag arrangement to face one another. Thus, a density of the channels 225 in a unit area of the base layer pattern 201a, 201b, and 201c may be increased.

A filling layer pattern 230 may be formed in an inner space of the channel 225. The filling layer pattern 230 may have a pillar shape or a solid cylindrical shape. The filling layer pattern 230 may include an insulation layer pattern, e.g., silicon oxide.

According to an embodiment, the channel 225 may have a pillar shape or a solid cylindrical shape. In this case, the filling layer pattern 230 may be omitted.

A dielectric layer structure 220 may be formed on an outer sidewall of the channel 225. The dielectric layer structure 220 may have a cup shape of which a central bottom is opened, or a straw shape.

The dielectric layer structure 220 may include a tunnel insulation layer, a charge storage layer, and a blocking layer which may be sequentially stacked from the outer sidewall of the channel 225. The blocking layer may include silicon oxide or a metal oxide such as hafnium oxide or aluminum oxide. The charge storage layer may include a nitride such as silicon nitride or a metal oxide, and the tunnel insulation layer may include an oxide such as silicon oxide. For example, the dielectric layer structure 220 may have an oxide-nitride-oxide (ONO) layers-stacked structure.

A pad 240 may be formed on the filling layer pattern 230, the channel 225, and the dielectric layer structure 220. For example, the filling layer pattern 230, the channel 225, and the dielectric layer structure 220 may be capped or closed by the pad 240. The pad 240 may include a polysilicon or single crystalline silicon. The pad 240 may further include n-type impurities, for example, phosphorus (P) or arsenic (As).

As illustrated in FIG. 21, a plurality of the pads 240 may be arranged in the second direction D2 to form a pad row substantially comparable to the channel row. A plurality of the pad rows may be arranged in the third direction D3.

The gate lines 260 (e.g., 260a through 260f) may be disposed on an outer sidewall of the dielectric layer structure 220 and may be spaced apart from one another in the first direction D1. In example embodiments, each gate line 260 may surround the channels 225 of at least one channel row and may be extended in the second direction D2.

For example, as illustrated in FIGS. 20 through 22, each gate line 260 may surround six channel rows, however, the number of channel rows surrounded by each gate line 260 is not limited thereto.

For example, a lowermost gate line 260a may serve as a ground selection line (GSL). Four gate lines 260b, 260c, 260d, and 260e on the GSL may serve as word lines. An uppermost gate line 260f on the word lines may serve as a string selection line (SSL).

In this case, the GSL, the word lines, and the SSL may be formed at a single level, four levels, and a single level, respectively. However, each of the number of levels of the GSL, the word lines, and the SSL is not specifically limited. According to some embodiments, the GSL and the SSL may be formed at two levels, and the word lines may be formed at 2^n levels, such as 4, 8, or 16 levels. The stacked number of the gate lines 260 may be determined in consideration of a circuit design and/or a degree of integration of the semiconductor device.

Insulating interlayers 202 (e.g., 202a to 202g) may be disposed between the gate lines 260 along the first direction D1. The insulating interlayers 202 may include a silicon oxide based material, e.g., silicon dioxide (SiO2), silicon oxycarbide (SiOC), or silicon oxyfluoride (SiOF). The gate lines 260 may be insulated from one another along the first direction D1 by the insulating interlayers 202.

A gate line cut region 256 may be formed through the gate lines 260 and the insulating interlayers 202 along the first direction D1. The gate line cut region 256 may have a trench shape or a ditch shape extending in the second direction D2.

A gate line cut pattern 270 extending in the second direction D2 may be disposed on the second impurity region 266. A plurality of the second impurity regions 266 and the gate line cut patterns 270 may be arranged along the third direction D3. In some embodiments, the second impurity region 266 may include n-type impurities, for example, phosphorus (P) or arsenic (As). The gate line cut pattern 270 may include an insulation layer pattern, e.g., silicon oxide. A metal silicide pattern, such as a cobalt silicide pattern and/or a nickel silicide pattern, may be further formed on the second impurity region 266.

In some example embodiments, a cell block sharing the gate lines 260 may be defined by the gate line cut pattern 270. The cell block may be divided into sub-cell blocks by the separation layer pattern 206. Thus, a dimension or a size of an individual block may be reduced, so that a segmented operational control may be achieved, In some embodiments, one of the second impurity regions 266 and one of the gate line cut patterns 270 may be provided per each base layer pattern 201a, 201b, and 201c.

As illustrated in FIG. 21, for example, the second impurity region 266 may be formed at a central region of the second base layer pattern 201b, and the gate line cut pattern 270 may be disposed on the second impurity region 266.

A connecting contact and a connecting wiring may be provided per each base layer pattern 201a, 201b, and 201c to transfer an electrical signal and/or a voltage from a peripheral circuit.

In example embodiments, the mold protection layer 212 may be formed on lateral portions of the base layer pattern 201a, 201b, and 201c, and the separation layer pattern 206. The first connecting contact 248a may extend through the mold protection layer 212 to make contact with a first impurity region 248 formed at the lateral portion of the base layer pattern 201a, 201b, and 201c. The second connecting contact 248b may extend through the mold protection layer 212, the base layer patterns 201a, 201b, and 201c, and the second lower insulation layer 160 to make contact with the lower wiring 150. A first insulation layer pattern 241a and a second insulation layer pattern 241b may be formed on sidewalls of the first connecting contact 248a and the second connecting contact 248b, respectively.

A first plug 291 and a second plug 293 may extend through an upper insulation layer 275 to be in contact with the first connecting contact 248a and the second connecting contact 248b, respectively. The connecting wiring 296 may be disposed on the upper insulation layer 275 to electrically connect the first and second plugs 291 and 293.

An upper gate line cut pattern 252 may be formed in an upper gate line cut region 250. The upper gate line cut pattern 252 may include an insulation material, e.g., silicon oxide.

In example embodiments, the upper gate line cut region 250 or the upper gate line cut pattern 252 may be provided for a separation of the SSL in each cell block. In this case, the upper gate line cut region 250 or the upper gate line cut pattern 252 may extend through an uppermost insulating interlayer 202g and the SSL 260f, and may extend partially through an insulating interlayer 202f directly under the SSL 260f.

The upper insulation layer 275 may be formed on the uppermost insulating interlayer 202g, the pad 240, the upper gate line cut pattern 252, the gate line cut pattern 270, the first connecting contact 248a and the second connecting contact 248b.

A bit line contact 280 may be formed through the upper insulation layer 275 to make contact with the pad 240. A plurality of the bit line contacts 280 may be formed to define an array comparable to an arrangement of the channels 225 or the pads 240.

The bit line 285 may be disposed on the upper insulation layer 275 to be electrically connected to the bit line contact 280. For example, the bit line 285 may extend in the third direction D3 to be electrically connected to a plurality of the bit line contacts 280. The bit line 285 and the separation layer pattern 205 may extend in substantially the same direction.

According to example embodiments described above, the base layer patterns 201a, 201b, and 201c may be physically separated by the separation layer pattern 206. Thus, the first to third base layer patterns 201a, 201b, and 201c are capable of being operated independently or individually.

The cell block may be further segmented or divided by the separation layer pattern 206, and thus signal interference or disturbance due to a large size of the cell block may be reduced. Thus, reliability of the semiconductor device may be increased.

Figure 23:
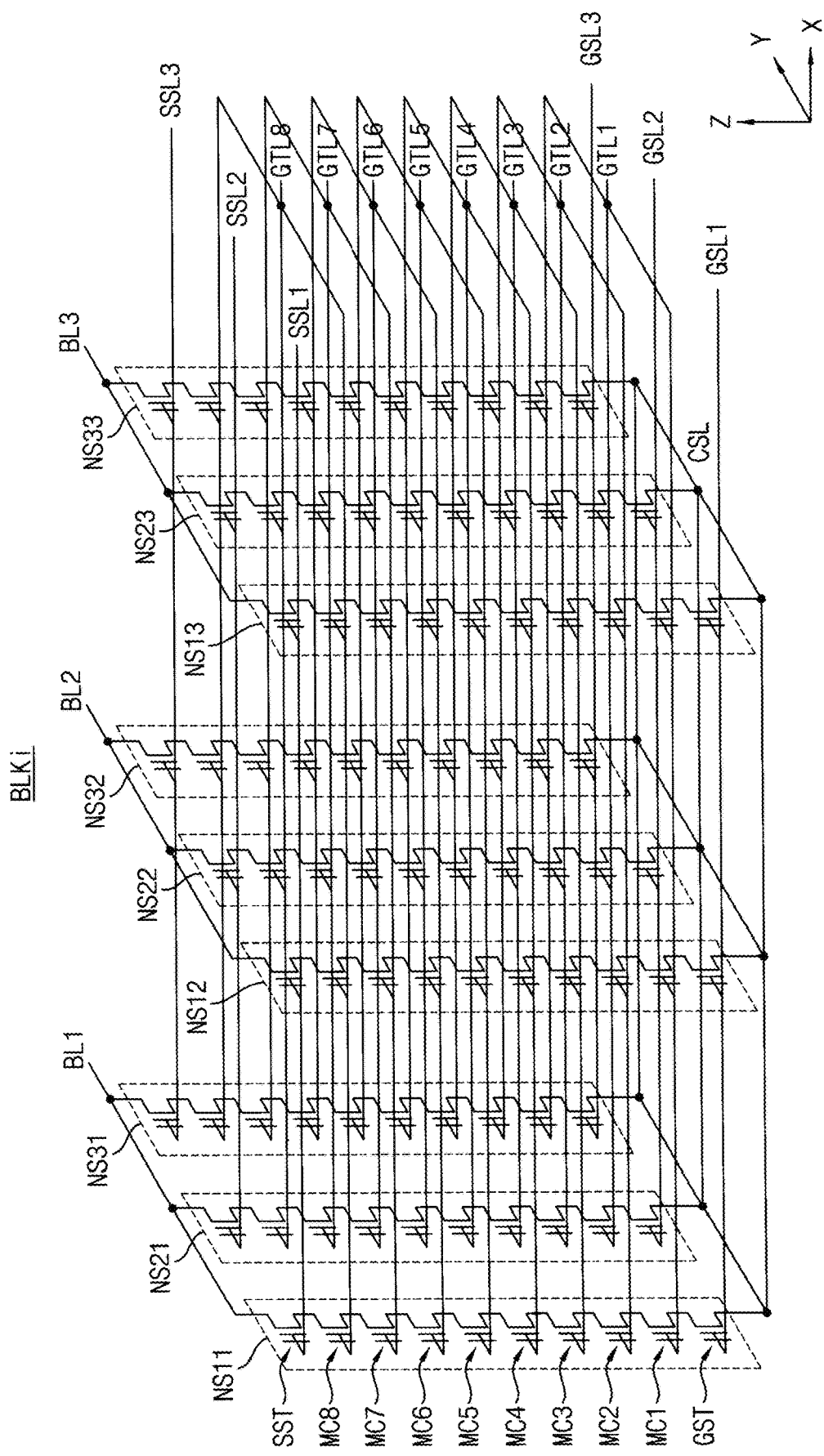
FIG. 23 is a circuit diagram illustrating an equivalent circuit of a memory block as described with reference to FIGS. 20 through 22.

FIG. 23 is a circuit diagram illustrating an equivalent circuit of a memory block as described with reference to FIGS. 20 through 22.

A memory cell array may include a plurality of memory blocks. A memory block BLKi of FIG. 23 may be formed on a substrate in a three-dimensional structure (or a vertical structure). For example, a plurality of NAND strings or cell strings included in the memory block BLKi may be formed in the first direction D1 perpendicular to the upper surface of the substrate.

Referring to FIG. 23, the memory block BLKi may include NAND strings NS11 to NS33 coupled between bit lines BL1, BL2, and BL3 and a common source line CSL. Each of the NAND strings NS11 to NS33 may include a string selection transistor SST, a plurality of memory cells MC1 to MC8, and a ground selection transistor GST. In FIG. 23, each of the NAND strings NS11 to NS33 is illustrated to include eight memory cells MC1 to MC8. However, example embodiments are not limited thereto. In some example embodiments, each of the NAND strings NS11 to NS33 may include any number of memory cells.

Each string selection transistor SST may be connected to a corresponding string selection line (one of SSL1 to SSL3). The plurality of memory cells MC1 to MC8 may be connected to corresponding gate lines GTL1 to GTL8, respectively. The gate lines GTL1 to GTL8 may be word lines, of which some may be dummy word lines. In addition, some of the gate lines GTL1 to GTL8 may be intermediate switching lines and the memory cells connected to the intermediate switching lines may be referred to as intermediate switching transistors. Each ground selection transistor GST may be connected to a corresponding ground selection line (one of GSL1 to GSL3). Each string selection transistor SST may be connected to a corresponding bit line (e.g., one of BL1, BL2, and BL3), and each ground selection transistor GST may be connected to the common source line CSL.

Word lines (e.g., WL1) having substantially the same height may be commonly connected, and the ground selection lines GSL1 to GSL3 and the string selection lines SSL1 to SSL3 may be separated. Additionally, the gate lines corresponding to the intermediate switching lines may be separated, as will be described below. In FIG. 7, the memory block BLKi is illustrated to be coupled to eight gate lines GTL1 to GTL8 and three bit lines BL1 to BL3. However, example embodiments are not limited thereto. Each memory block in the memory cell array 100 may be coupled to any number of word lines and any number of bit lines.

Figure 24:
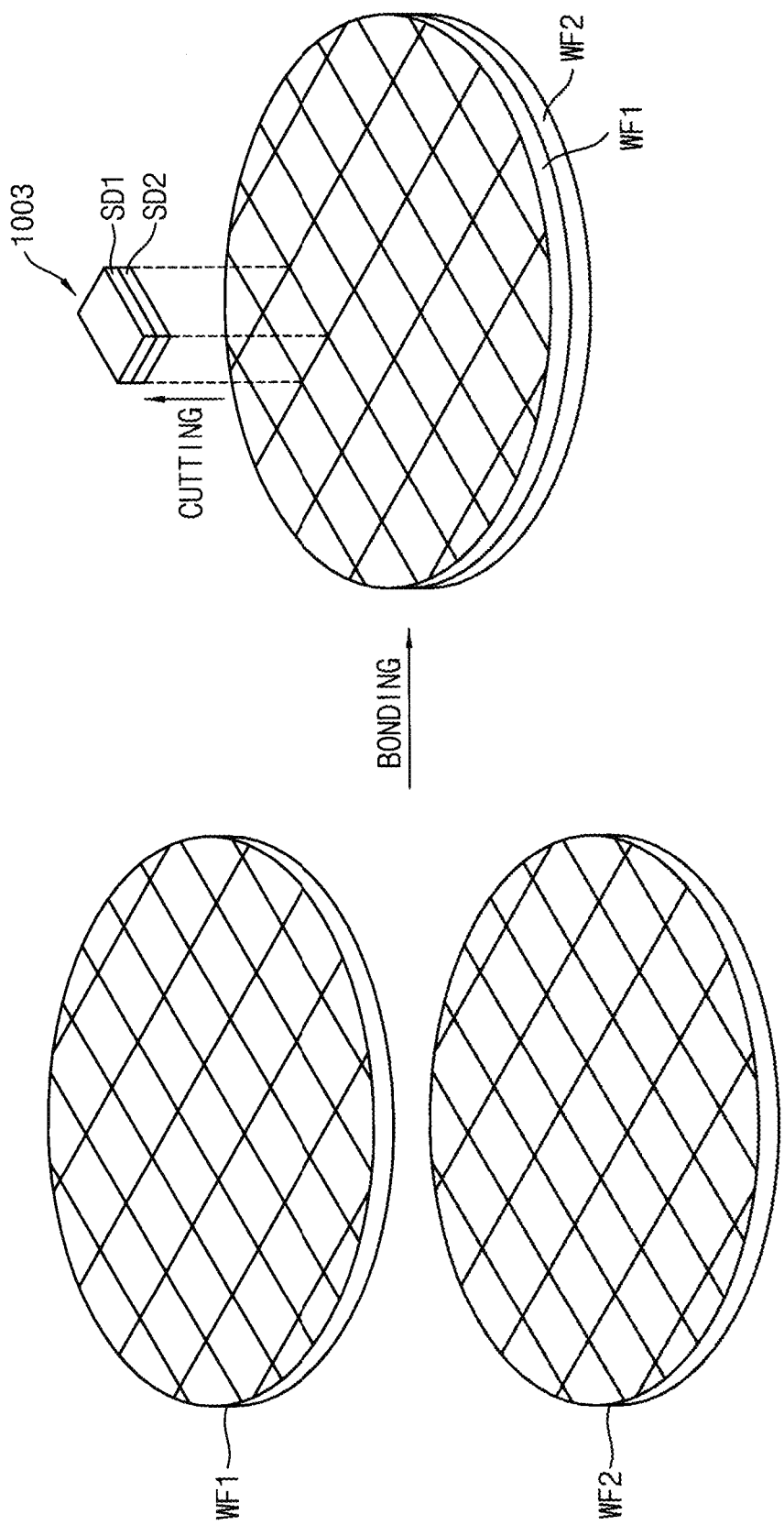
FIG. 24 is a diagram for describing manufacturing processes of a stacked semiconductor device according to example embodiments.

FIG. 24 is a diagram for describing manufacturing processes of a stacked semiconductor device according to example embodiments.

Referring to FIG. 24, respective integrated circuits may be formed in a first wafer WF1 and a second wafer WF2. The same circuits may be integrated in the first wafer WF1 and the second wafer WF2 or different circuits may be integrated in the first wafer WF1 and the second wafer WF2. For example, pixel arrays may be formed in the first wafer WF1 and other circuits may be formed in the second wafer WF2. Even though FIG. 24 illustrates the vertical stacking of the two wafers WF1 and WF2 (e.g., wafer WF1 is stacked on wafer WF2), three or more wafers may be stacked vertically.

After the integrated circuits are formed in the first and second wafers WF1 and WF2, the first wafer WF1 and the second wafer WF2 are bonded. The bonded wafers WF1 and WF2 are cut and divided into a plurality of chips where each chip corresponds to a semiconductor device 1003 including a first semiconductor die SD1 and a second semiconductor die SD2 that are stacked vertically (e.g., the first semiconductor die SD1 is stacked on the second semiconductor die SD2, etc.). Each cut portion of the first wafer WF1 corresponds to the first semiconductor die SD1 and each cut portion of the second wafer WF2 corresponds to a second semiconductor die SD2.

According to example embodiments, each semiconductor device 1003 may include first and second semiconductor dies SD1 and SD2 that are stacked in the vertical direction. Each of the semiconductor dies SD1 and SD2 includes a central region and an edge region surrounding the central region. A memory cell structure is formed in a plurality of upper sub regions of the central region of the first semiconductor die SD1. A peripheral circuit is formed in a plurality of lower sub regions of the central region of the second semiconductor die SD2. A three-dimensional outer crack detection structure is formed in the edge region of the first semiconductor die SD1 and the second semiconductor die SD2. A plurality of inner crack detection structures are respectively formed in the plurality of upper sub regions and the plurality of the lower sub regions. A plurality of path selection circuits is provided to control an electrical connection between the outer crack detection structure and the plurality of inner crack detection structures.

In some example embodiments, the three-dimensional outer crack detection structure may include a single conduction loop, such as described with reference to the example of FIG. 8. In other example embodiments, the three-dimensional crack detection structure may include two conduction loops, such as described with reference to the example of FIG. 13. Even though example embodiments will be described with reference to FIGS. 25 and 26 for a single conduction loop covering a plurality of semiconductor dies SD1 and SD2, it should be understood that the two conduction loops may be formed to cover the plurality of semiconductor dies SD1 and SD2.

Figure 25:
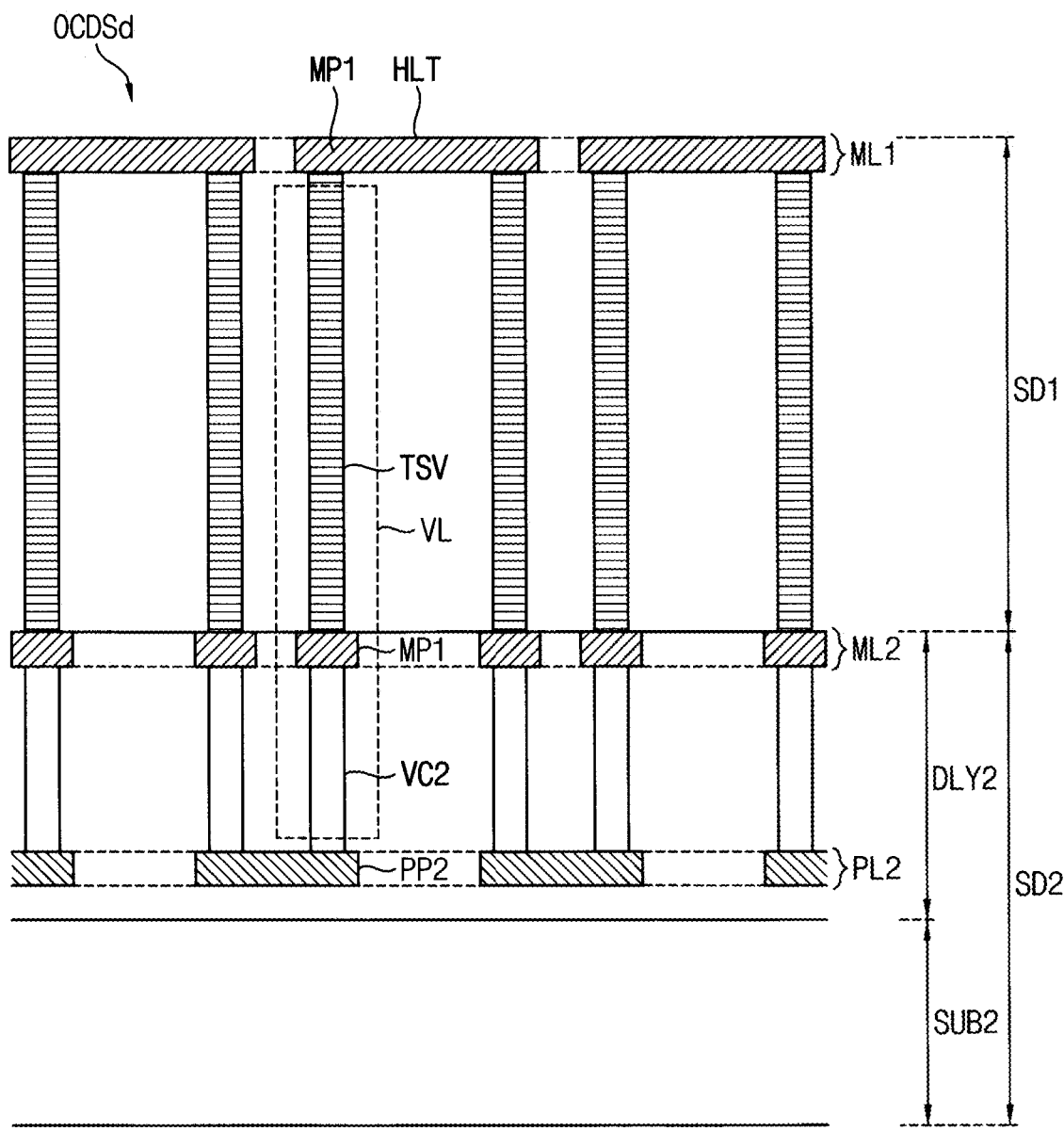
FIGS. 25 and 26 are cross-sectional diagrams illustrating a vertical structure of a three-dimensional crack detection structure according to example embodiments.
Figure 26:
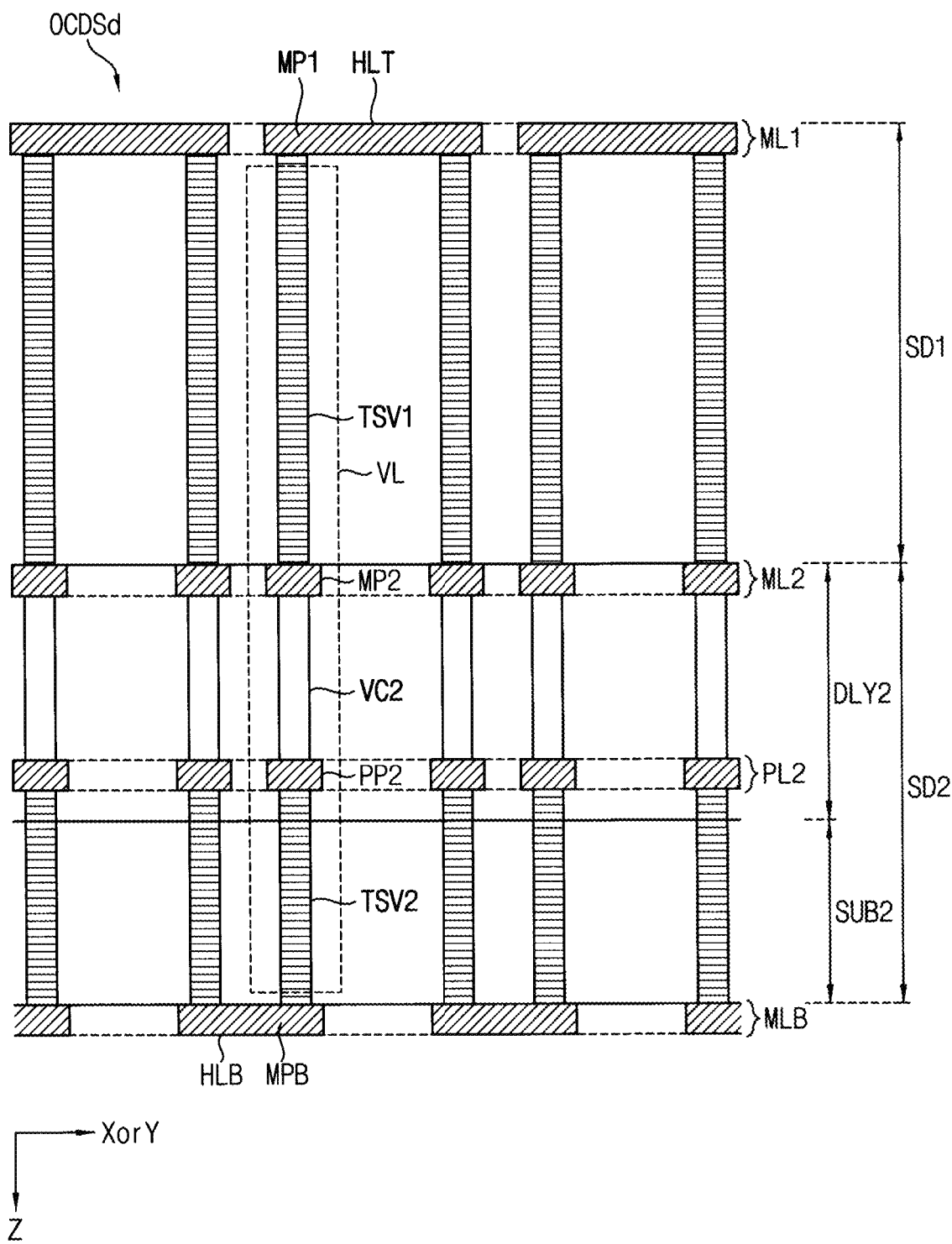

FIGS. 25 and 26 are cross-sectional diagrams illustrating a vertical structure of a three-dimensional crack detection structure according to example embodiments.

Referring to FIG. 25, a three-dimensional outer crack detection structure OCDSd may be formed in a first semiconductor die SD1 and a second semiconductor die SD2. A memory cell structure may be formed in the first semiconductor die SD1 and a peripheral circuit may be formed in the second semiconductor die SD2. The second semiconductor die SD2 may include a semiconductor substrate SUB2 and a dielectric layer DLY2 in which upper structures of the second semiconductor substrate SUB2 are formed. The first and second semiconductor dies SD1 and SD2 may include a plurality of conduction layers. For example, the first semiconductor die SD1 may include a first metal layer ML1, and the dielectric layer DLY2 may include a second metal layer ML2 and a second polysilicon layer PL2. The metal layers ML1 and ML2 may be the uppermost metal layers in the respective semiconductor dies SD1 and SD2. The polysilicon layer PL2 may include a gate polysilicon layer in which gates of transistors in the semiconductor integrated circuits are formed.

The outer crack detection structure OCDSd may include a plurality of top horizontal line segments HLT formed in the first conduction layer ML1 of the first semiconductor die SD1 (that is, the uppermost semiconductor die in the stacked structure), a plurality of bottom horizontal line segments HLB formed in the second conduction layer PL2 of the second semiconductor die SD2 (that is, the lowest semiconductor die in the stacked structure) and a plurality of vertical line segments VL connecting the top horizontal line segments HLT and the bottom horizontal line segments HLB respectively to form the outer crack detection structure OCDSd.

In the embodiment of FIG. 25, the first conduction layer ML1 may correspond to an uppermost metal layer among the metal layer of the first semiconductor die SD1, and the second conduction layer PL2 may correspond to the polysilicon layer of the second semiconductor die SD2. The top horizontal line segments HLT may include metal line patterns MP1 formed in the metal layer ML1 of the first semiconductor die SD1, and the bottom horizontal line segments HLB may include polysilicon line patterns PP2 formed in the polysilicon layer PL2 of the second semiconductor die SD2.

The vertical line segments VL may include vertical contacts VC1, TSV and VC2 to connect the metal line patterns MP1 in the metal layer ML1 and the polysilicon line patterns PP in the polysilicon layer PL2. As illustrated in FIG. 25, the vertical contacts may include the through-substrate vias TSV penetrating the first semiconductor die SD1. The vertical line segments VL may further include conduction line patterns MP2 formed in the intermediate conduction layers ML2.

Referring to FIG. 26, a three-dimensional outer crack detection structure OCDSd may include a plurality of top horizontal line segments HLT formed in the first conduction layer ML1 of the first semiconductor die SD1 (that is, the uppermost semiconductor die in the stacked structure), a plurality of bottom horizontal line segments HLB formed in the second conduction layer MLB of the second semiconductor die SD2 (that is, the lowest semiconductor die in the stacked structure) and a plurality of vertical line segments VL connecting the top horizontal line segments HLT and the bottom horizontal line segments HLB respectively to form the outer crack detection structure OCDSd.

In the embodiment of FIG. 26, the first conduction layer ML1 may correspond to an uppermost metal layer among the metal layer of the first semiconductor die SD1, and the second conduction layer PL2 may correspond to the metal layer on the bottom surface of the second semiconductor die SD2. The top horizontal line segments HLT may include metal line patterns MP1 formed in the metal layer ML1 of the first semiconductor die SD1, and the bottom horizontal line segments HLB may include metal line patterns MPB formed in the metal layer MLB on the bottom surface of the second semiconductor die SD2.

The vertical line segments VL may include vertical contacts TSV1, VC2 and TSV2 to connect the metal line patterns MP1 in the metal layer ML1 and the metal line patterns MPB in the metal layer MLB. As illustrated in FIG. 22, the vertical contacts may include the through-substrate vias TSV1 and TSV2 penetrating the first semiconductor die SD1 and the second semiconductor die SD2, respectively. The vertical line segments VL may further include conduction line patterns MP2 and PP2 respectively formed in the intermediate conduction layers ML2 and PL2.

As described with reference to FIGS. 25 and 26, the three-dimensional outer crack detection structure OCDSd according to example embodiments may be expanded in the vertical direction Z to the various depths. Using the three-dimensional crack detection structure, the crack penetration of various types may be detected thoroughly.

Figure 27B:
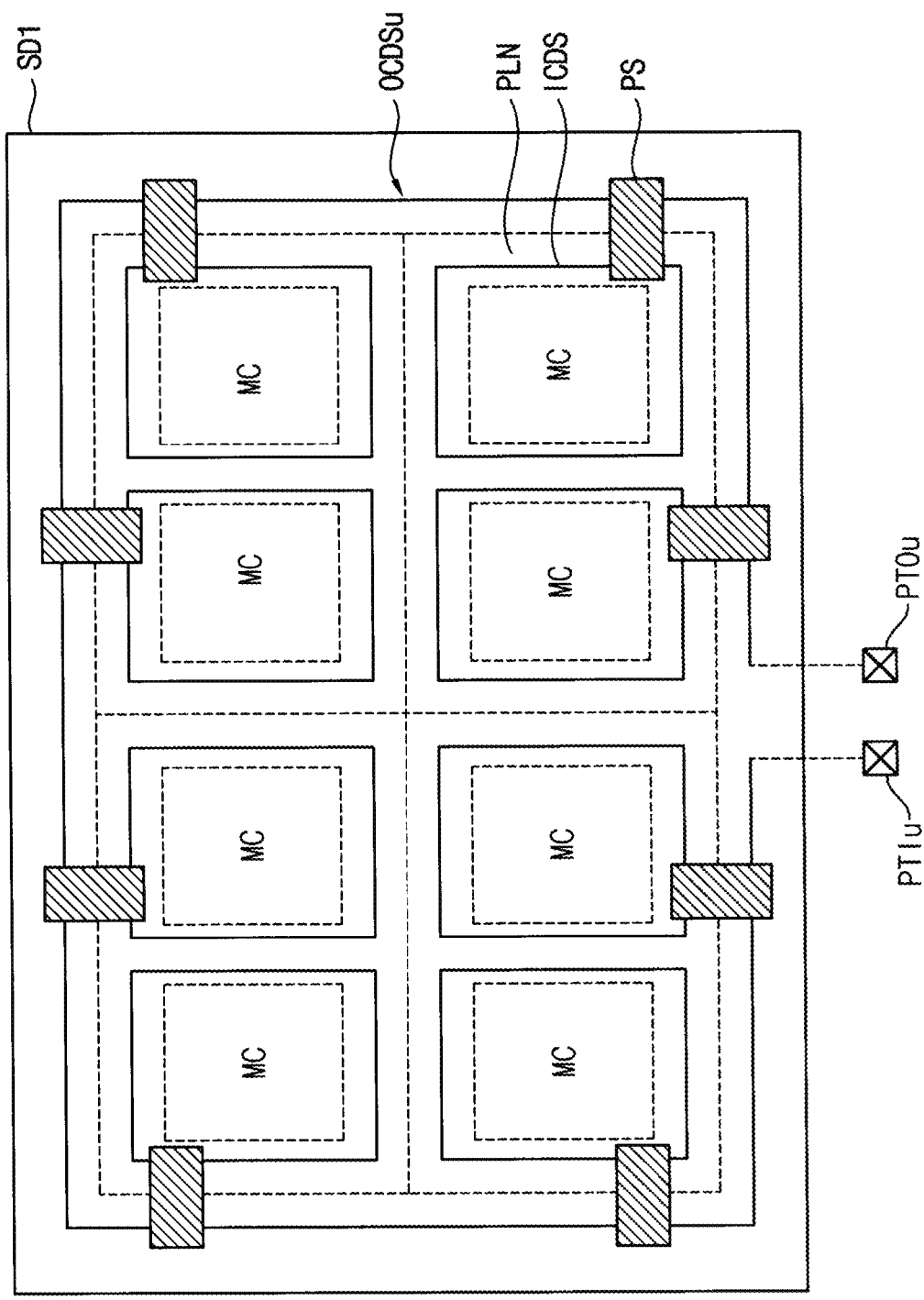
Figure 28A:
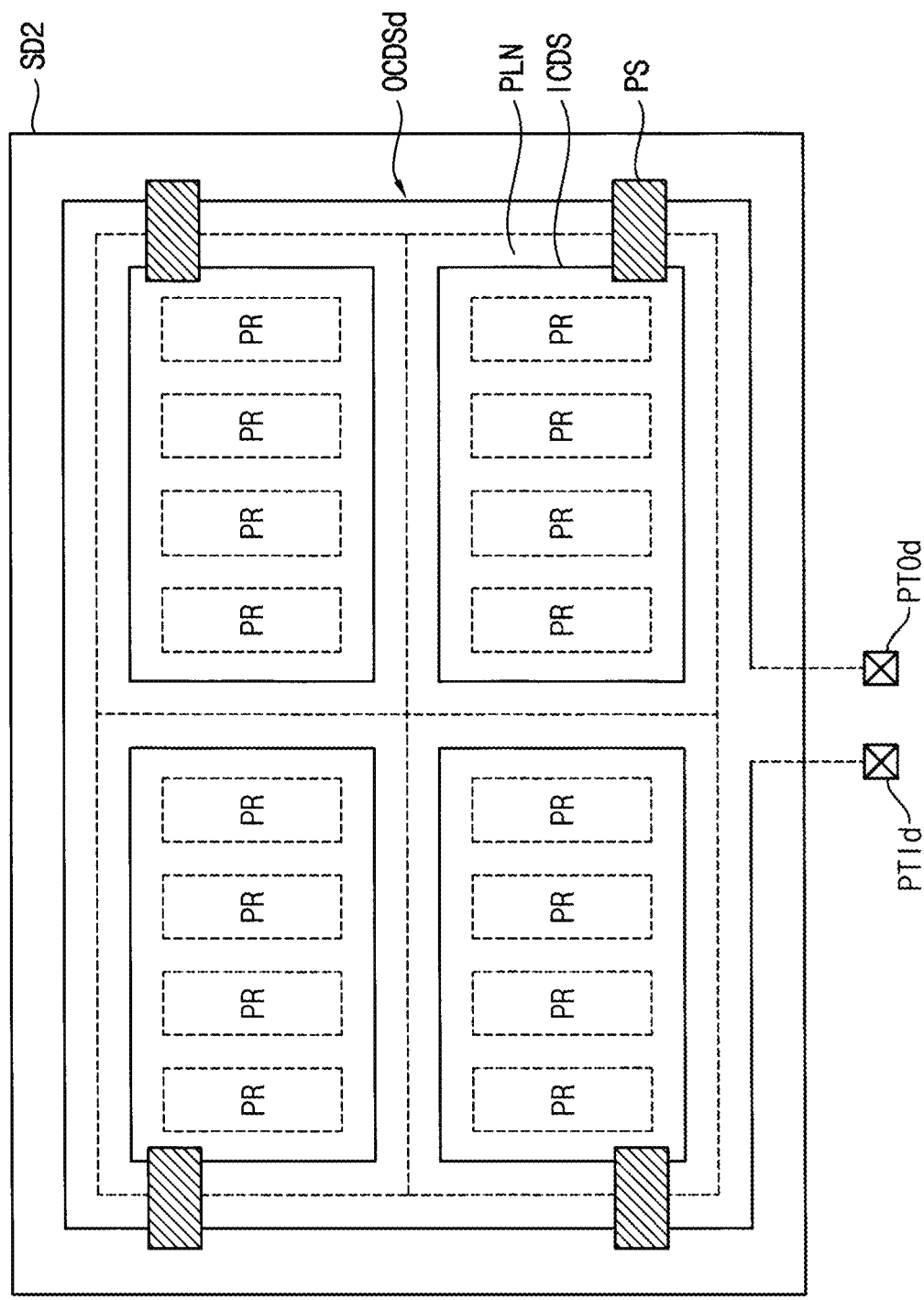
Figure 28B:
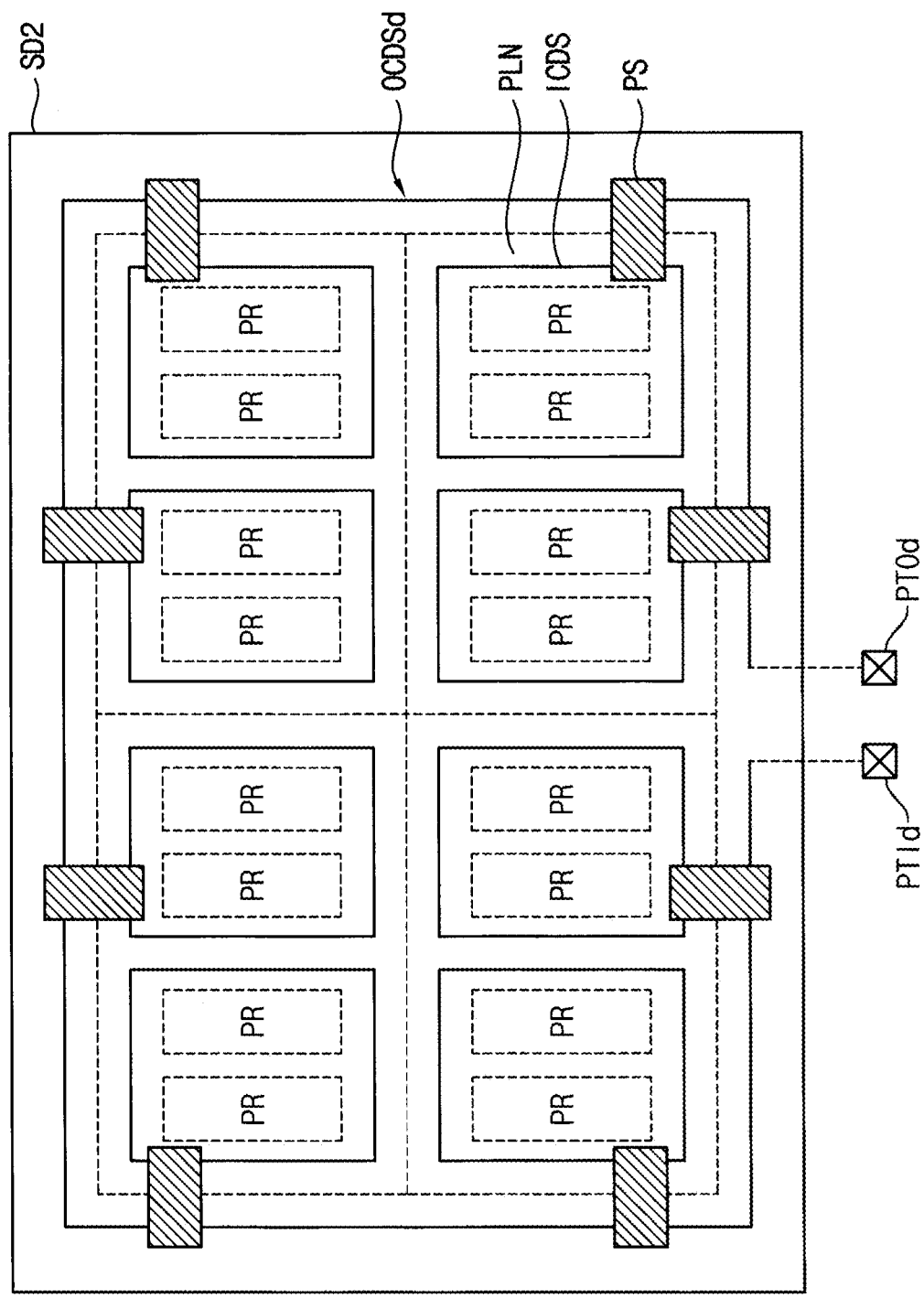

FIGS. 27A and 27B are top views illustrating a layout of a first semiconductor die of a nonvolatile memory device according to example embodiments, and FIGS. 28A, 28B and 28C are top views illustrating a layout of a second semiconductor die of a nonvolatile memory device according to example embodiments.

Referring to FIGS. 27A through 28C, a plurality of sub regions of a central region as described above may correspond to a plurality of memory planes PLN. In the first semiconductor die SD1, each memory plane PLN may include a plurality of memory cell array regions, e.g., two memory cell array regions MC. In the second semiconductor die SD2, each memory plane PLN may include a plurality of peripheral circuit regions, e.g., four peripheral circuit regions PR.

FIG. 27A illustrates an example embodiment that each memory plane PLN correspond to one upper sub region, and FIG. 27B illustrates an example embodiment that each memory plane PLN correspond to two upper sub regions. FIG. 28A illustrates an example embodiment that each memory plane PLN correspond to one lower sub region, FIG. 28B illustrates an example embodiment that each memory plane PLN correspond to two lower sub regions, and FIG. 28C illustrates an example embodiment that each memory plane PLN correspond to four lower sub regions. A nonvolatile memory device according to example embodiments may be implemented as a combination of one layout of FIGS. 27A and 27B and one layout of FIGS. 28A, 28B and 28C. As such, in the nonvolatile memory device, a number of the plurality of upper sub regions may be equal to or different from a number of the plurality of lower sub regions, according to example embodiments.

Figure 29:
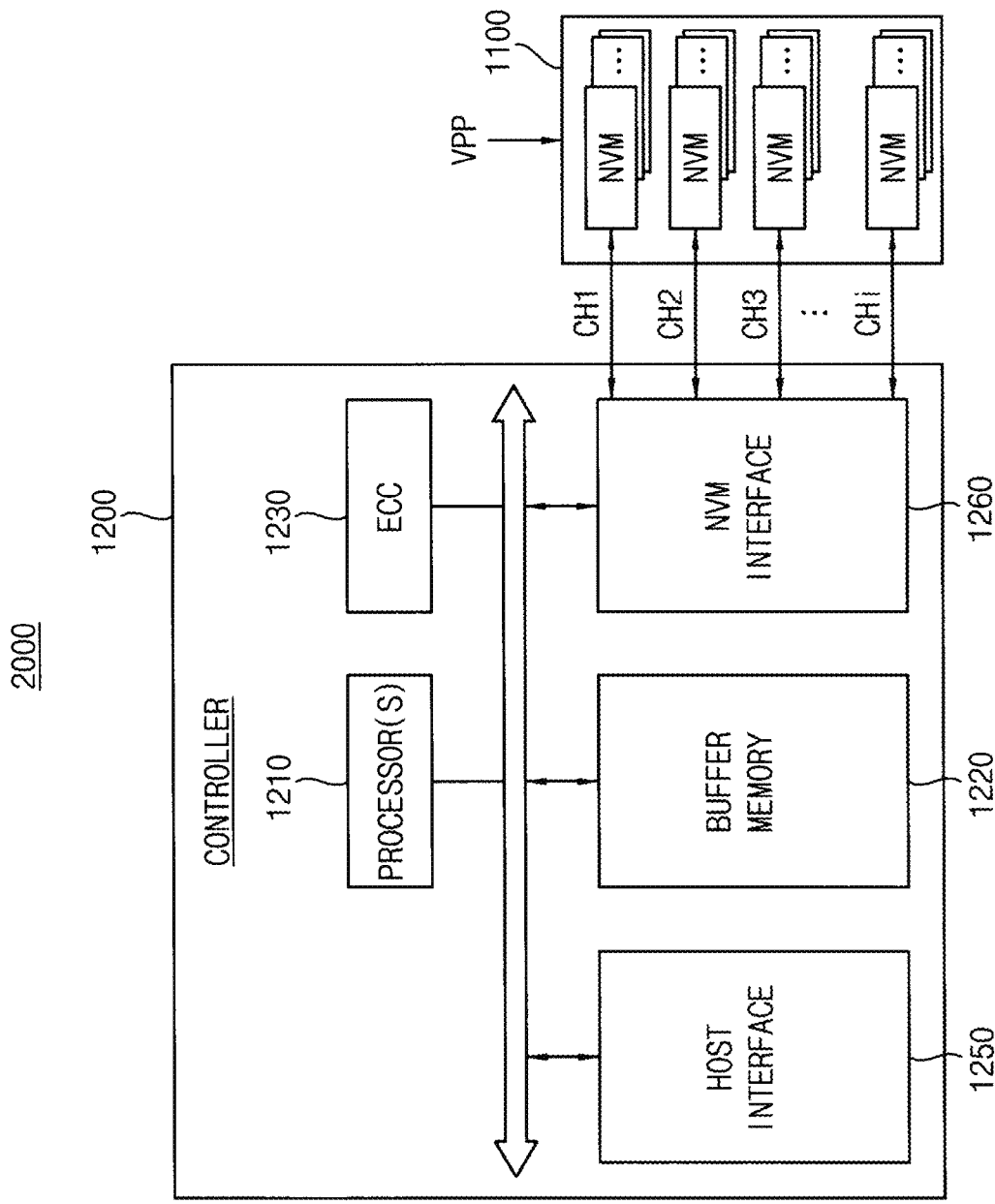
FIG. 29 is a block diagram illustrating a storage device according to example embodiments.

FIG. 29 is a block diagram illustrating a storage device according to example embodiments.

Referring to FIG. 29, a storage device 2000 includes multiple nonvolatile memory devices 1100 and a storage controller 1200. The storage device 2000 may be a solid state drive (SSD).

The nonvolatile memory devices 1100 may be configured optionally to receive a high voltage VPP. The nonvolatile memory devices 1100 may correspond to the above-described nonvolatile memory devices according to example embodiments. Thus, the nonvolatile memory devices 1100 may include the crack detection structures according to example embodiments.

The storage controller 1200 is connected to the nonvolatile memory devices 1100 through multiple channels CH1 to CHi. The storage controller 1200 includes one or more processors 1210, a buffer memory 1220, an error correction code (ECC) circuit 1230, a host interface 1250, and a nonvolatile memory interface 1260. The buffer memory 1220 stores data used to drive the storage controller 1200. The buffer memory 1220 comprises multiple memory lines each storing data or a command. The ECC circuit 1230 calculates error correction code values of data to be programmed at a writing operation and corrects an error of read data using an error correction code value at a read operation. In a data recovery operation, the ECC circuit 1230 corrects an error of data recovered from the nonvolatile memory devices 1100.

One or more elements of FIG. 29 may be implemented by processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The crack detection structures according to example embodiments may be applied to any devices and systems in which semiconductor integrated circuits are formed. For example, the crack detection structures may be applied to systems such as a memory card, a solid state drive (SSD), an embedded multimedia card (eMMC), a universal flash storage (UFS), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

The foregoing is illustrative of example embodiments and is not to be construed as limiting thereof. Although a few example embodiments have been described, those skilled in the art will readily appreciate that many modifications are possible in the example embodiments without materially departing from the present inventive concept.

What is claimed is:

1. A semiconductor device comprising:
    a semiconductor die including a central region and an edge region surrounding the central region;
    a semiconductor integrated circuit in a plurality of sub regions of the central region;
    an outer crack detection structure in the edge region;
    a plurality of inner crack detection structures, each of the plurality of inner crack detection structures including a loop in a respective sub region, of the plurality of sub regions; and
    a plurality of path selection circuits configured to control an electrical connection between the outer crack detection structure and the plurality of inner crack detection structures.

2. The semiconductor device of claim 1, wherein the outer crack detection structure is divided into a plurality of loop segments and the plurality of loop segments are electrically connected via the plurality of path selection circuits to form a conduction loop.

3. The semiconductor device of claim 2, wherein a first end of each inner crack detection structure of the plurality of inner crack detection structures is connected to each path selection circuit of the plurality of path selection circuits and a second end of the each inner crack detection structure of the plurality of inner crack detection structure is connected to one of the plurality of loop segments.

4. The semiconductor device of claim 2, wherein each path selection circuit of the plurality of path selection circuits includes:
    an outer switch connected between two loop segments among the plurality of loop segments; and
    an inner switch connected between each inner crack detection structure of the plurality of inner crack detection structures and a first loop segment of the two loop segments.

5. The semiconductor device of claim 4, wherein a first end of the each inner crack detection structure of the plurality of inner crack detection structure is connected to the inner switch and a second end of the each inner crack detection structure of the plurality of inner crack detection structure is connected to a second loop segment of the two loop segments.

6. The semiconductor device of claim 4, wherein the outer switch is configured to receive an outer connection signal to be turned on activation of the outer connection signal, and the inner switch is configured to receive an inner connection signal to be turned on activation of the inner connection signal.

7. The semiconductor device of claim 6, wherein one of the outer connection signal and the inner connection signal is selectively activated and one of the outer switch and the inner switch is selectively turned on.

8. The semiconductor device of claim 7, wherein a crack in the edge region is detected when the outer switch is turned on and a crack in each sub region of the plurality of sub regions is detected when the inner switch is turned on.

9. The semiconductor device of claim 1, wherein the outer crack detection structure is a three-dimensional crack detection structure in a ring shape in the edge region to surround the central region, the three-dimensional crack detection structure extending in a vertical direction.

10. The semiconductor device of claim 9, wherein the semiconductor die includes a first conduction layer and a second conduction layer below the first conduction layer, and
    wherein the three-dimensional crack detection structure includes a conduction loop that extends in the vertical direction through the first conduction layer and the second conduction layer.

11. The semiconductor device of claim 10, wherein the conduction loop includes:
    a plurality of top horizontal line segments in the first conduction layer;
    a plurality of bottom horizontal line segments in the second conduction layer; and
    a plurality of vertical line segments connecting the top horizontal line segments and the bottom horizontal line segments to form the conduction loop.

12. The semiconductor device of claim 11, wherein the first conduction layer corresponds to an uppermost metal layer among a plurality of metal layers that are above a semiconductor substrate of the semiconductor die, and
    wherein the second conduction layer corresponds to a gate polysilicon layer in which gate electrodes of transistors of the semiconductor integrated circuits are formed.

13. The semiconductor device of claim 11, wherein the first conduction layer corresponds to a metal layer that is above a semiconductor substrate of the semiconductor die, and
    wherein the second conduction layer corresponds to a metal layer on a bottom surface of the semiconductor substrate.

14. The semiconductor device of claim 11, wherein the plurality of vertical line segments includes through-substrate vias that penetrate a semiconductor substrate of the semiconductor die.

15. A nonvolatile memory device comprising:
    a first semiconductor die and a second semiconductor die, the first semiconductor die being stacked in a vertical direction on the second semiconductor die, each of the first semiconductor die and second semiconductor die including a central region and an edge region surrounding the central region;
    a memory cell structure in a plurality of upper sub regions of the central region of the first semiconductor die;
    a peripheral circuit in a plurality of lower sub regions of the central region of the second semiconductor die;
    an outer crack detection structure in the edge region of the first semiconductor die and the second semiconductor die;

a plurality of inner crack detection structures in the plurality of upper sub regions, respectively, and the plurality of lower sub regions, respectively; and a plurality of path selection circuits configured to control an electrical connection between the outer crack detection structure and the plurality of inner crack detection structures.

16. The nonvolatile memory device of claim 15, wherein the first semiconductor die is in a first wafer and the second semiconductor die is in a second wafer, and wherein, after the first wafer and the second wafer are bonded, the nonvolatile memory device is provided by cutting the bonded wafers.

17. The nonvolatile memory device of claim 15, wherein the outer crack detection structure is divided into a plurality of loop segments and the plurality of loop segments are electrically connected via the plurality of path selection circuits to form a conduction loop.

18. The nonvolatile memory device of claim 17, wherein each path selection circuit of the plurality of path selection circuits includes:

an outer switch connected between two loop segments among the plurality of loop segments; and an inner switch connected between each inner crack detection structure of the plurality of inner crack detection structures and one of the two loop segments.

19. The nonvolatile memory device of claim 15, wherein a number of the plurality of upper sub regions is different from a number of the plurality of lower sub regions.

20. A storage device comprising:

one or more nonvolatile memory devices; and processing circuitry configured to control access to the nonvolatile memory devices, each of the nonvolatile memory devices comprising:

a first semiconductor die and a second semiconductor die, the first semiconductor die being stacked in a vertical direction on the second semiconductor die, each of the first semiconductor die and second semiconductor die including a central region and an edge region surrounding the central region;

a memory cell structure in a plurality of upper sub regions of the central region of the first semiconductor die;

a peripheral circuit in a plurality of lower sub regions of the central region of the second semiconductor die;

an outer crack detection structure in the edge region of the first semiconductor die and the second semiconductor die;

a plurality of inner crack detection structures in the plurality of upper sub regions, respectively, and the plurality of the lower sub regions, respectively; and a plurality of path selection circuits configured to control an electrical connection between the outer crack detection structure and the plurality of inner crack detection structures.

* * * * *